US007321166B2

(12) United States Patent
Sakai et al.

(10) Patent No.: US 7,321,166 B2
(45) Date of Patent: Jan. 22, 2008

(54) WIRING BOARD HAVING CONNECTING WIRING BETWEEN ELECTRODE PLANE AND CONNECTING PAD

(75) Inventors: Jun Sakai, Tokyo (JP); Hirobumi Inoue, Tokyo (JP); Kazuhiro Motonaga, Kanagawa (JP)

(73) Assignees: NEC Corporation, Tokyo (JP); NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/274,182

(22) Filed: Nov. 16, 2005

(65) Prior Publication Data

US 2006/0103004 A1 May 18, 2006

(30) Foreign Application Priority Data

Nov. 17, 2004 (JP) .............................. 2004-332687

(51) Int. Cl.
*H01L 23/12* (2006.01)
(52) U.S. Cl. ...................... 257/700; 257/750; 257/758; 257/691; 257/760; 257/748; 257/E23.001; 257/E23.005; 257/E23.194
(58) Field of Classification Search ................ 257/691, 257/760, 700, 750, 758, 361, 748
See application file for complete search history.

(56) References Cited

U.S. PATENT DOCUMENTS 6,329,228 B1 * 12/2001 Terashima .................. 438/156

6,483,714 B1 * 11/2002 Kabumoto et al. ......... 361/760
2002/0050407 A1 * 5/2002 Sohn et al. ................. 174/262
2004/0122279 A1 * 6/2004 Faulkner et al. ............... 600/1

FOREIGN PATENT DOCUMENTS

| JP | 2001-024084 A |   | 1/2001 |         |
|----|---------------|---|--------|---------|
| JP | 02001015636 A | * | 1/2001 | ..... 23/12 |
| JP | 2001-308222 A |   | 11/2001 |        |

* cited by examiner

*Primary Examiner*—Thao X. Le
*Assistant Examiner*—Marc-Anthony Armand
(74) *Attorney, Agent, or Firm*—Sughrue Mion. Pllc.

(57) ABSTRACT

It is to provide a wiring board for a semiconductor integrated circuit package, which exhibits an excellent signal property and a high effect for decreasing the switching noise at the time of mounting an LSI of an area-array structure. In a multilayer wiring board for a package, which comprises, on a wiring layer of an LSI chip mount surface, a ground pad, a power supply pad, and a signal pad for mounting LSI chip, and a ground plane that extends around a group of those pads, the ground pad disposed on the inner side, among the above-described pads, is connected to the ground plane that surrounds the pad group through a connecting wiring.

19 Claims, 21 Drawing Sheets

100 PACKAGE BOARD
101 SIGNAL LINE
102 POWER SUPPLY PLANE
103 GROUND PLANE OF THE FIRST LAYER
104 GROUND PLANE OF THE FOURTH LAYER
106 GROUND FC PAD
107 POWER SUPPLY FC PAD
108 SIGNAL FC PAD
109a, 109b, 109c, 109d, 109e, 109f, 109g INTERLAYER CONNECTING CONDUCTOR
110 CONNECTING WIRING
111, 112, 113 LAND
123 SOLDER BALL

FIRST LAYER

SECOND LAYER

THIRD LAYER

FOURTH LAYER

FIFTH LAYER

100 PACKAGE BOARD
101 SIGNAL LINE
102 POWER SUPPLY PLANE
103 GROUND PLANE OF THE FIRST LAYER
104 GROUND PLANE OF THE FOURTH LAYER
106 GROUND FC PAD
107 POWER SUPPLY FC PAD
108 SIGNAL FC PAD
109a, 109b, 109c, 109d, 109e, 109f, 109g INTERLAYER CONNECTING CONDUCTOR
110 CONNECTING WIRING
111, 112, 113 LAND
123 SOLDER BALL

109h INTERLAYER CONNECTING CONDUCTOR
114 POWER-SUPPLY-SIDE PAD
121 LSI CHIP
122 BUMP
124 CHIP CONDENSER

WIRING BOARD HAVING CONNECTING WIRING BETWEEN ELECTRODE PLANE AND CONNECTING PAD

BACKGROUND OF THE INVENTION

1. Field of the Invention

The present invention relates to a wiring board for a semiconductor integrated circuit package and a semiconductor integrated circuit device using the wiring board. Particularly, it relates to a wiring board for a semiconductor integrated circuit package for mounting an LSI chip by flip-chip connection and to a semiconductor integrated circuit device in which an LSI chip is mounted on the wiring board.

2. Description of the Related Art

Recently, the number of pins and the frequency of an LSI have been increased. Accordingly, when forming an LSI package, there is a technique that is broadly used for flip-chip connecting the LSI to a package board. FIG. 1 is a plan view for showing an example of a connecting surface of an LSI between a package, which has bumps arranged in an area-array form. It is not possible to deal with the LSI with a large number of pins by a peripheral arrangement in which bumps are disposed only in the peripheral part of the connecting surface. Thus, when there are a large number of pins as shown in FIG. 1, there is employed a structure in which bumps 222 are disposed on the entire connecting surface of an LSI chip 221. On a package board to which the LSI chip with plane-arranged bumps is mounted, flip-chip pads (referred to as FC pads hereinafter) are arranged in an area-array form.

There have been proposed a structure of arrangement which allots a net of signals to the bumps of the outer periphery and allots nets of ground and power supply to the bumps on the inner side, when the bumps of LSI with large number of pins are arranged in an area-array form (for example, see Patent Documents 1, 2). One of the reasons for employing such bump arranging structure is that if the signal is allotted to the inner bumps, the number of columns for the signal pads is increased on the package board. Thus, it increases the number of wiring layers for enclosing signal wirings that connect the FC pads and BGA (ball grid array) land, thereby increasing the cost.

As a package board for flip-chip mounting the LSI chip shown in FIG. 1, it is considered preferable to employ a structure that disposes a ground plane (or a power supply plane) on the surface layer to which the LSI chip is mounted and disposes a signal wiring layer on the inner layer for stabilizing signal and suppressing signal leakage/interference. FIG. 2 and FIG. 3 show an example of the package board which is designed in view of such consideration. FIG. 2 is a cross section of a semiconductor integrated circuit device which is constituted by mounting the LSI chip on the package board, and FIG. 3 are top plan views of each wiring layer of the package board (In FIG. 2, there is only shown a right-half part since the package has a symmetrical structure). In FIG. 2, on a package board 200, the LSI chip 221 is mounted through the bumps 222. In the package board 200, five layers of wiring layers are stacked. The wiring layer to which the LSI chip is mounted is referred to as a first layer, and it ascends in order towards the lower side. Thus, the wiring layer to which a solder ball 223 is formed is referred to as a fifth layer. The first layer is provided with FC pads 206-208 and a ground plane 203 for installing the LSI chip 221, the second layer with a signal line 201, the third layer with a power supply plane 202, the fourth layer with a ground plane 204, and the fifth layer with lands 211-213 for mounting the solder ball 223. Wirings in each layer are connected by interlayer connecting conductors 209a-209g, which are formed by embedding via holes with a conductive material. For simplifying the drawing, the LSI chip 221 is illustrated with thirty-six pins, however, the number of pins actually used in the LSI reaches some hundreds to some thousands.

As shown in FIG. 3A, among the thirty-six FC pads, the outermost pad is allotted to the signal FC pad 208, the inner pads to an FC pad 206 and to a power supply FC pad 207. The path for the signal is connected from the signal FC pad 208 in the first layer to the second layer through the interlayer connecting conductor 209d, led to the peripheral part in the second layer by the signal wiring 201 as shown in FIG. 3B and, thereafter, brought to the land 213 of the fifth layer through the interlayer connecting conductor 209g. The signal line 201 is covered by the ground plane 203 and the power supply plane 202 from its top and bottom, thereby forming a strip line.

In the third layer where the power supply plane 202 is formed, as shown in FIG. 3C, there are formed an opening for letting through the interlayer connecting conductors 209a, 209e for ground and an opening for letting through the interlayer connecting conductor 209g for signals. Further, in the fourth layer where the ground plane 204 is formed, as sown in FIG. 3D, there are formed an opening for letting through the interlayer connecting conductor 209f for the power supply and an opening for letting through the interlayer connecting conductor 209g for the signals. In the fifth layer, as shown in FIG. 3E, the land 211 for the ground, the land 212 for the power supply, and the land 213 for the signals are arranged in an area-array form.

Like this example, as a way of determining allotment with respect to each wiring layer of the package board, it is advantageous to allot the ground plane or the power supply plane in the first layer and allot the signal wiring in the second layer or lower in terms of the electric property. The reason for this is that this arrangement provides a strip line structure in which the top and bottom of the signal wiring are covered by the power supply plane or the ground plane (hereinafter, "power supply or ground" is expressed as "power-supply/ground"). Thus, the transmission path suited for high-speed signal transmission can be formed and the signal wiring can be shielded. However, if the signal wiring is disposed on the first layer, the signal wiring is to be exposed. Thus, it may be affected by external noises or the characteristic impedance may be fluctuated by the influence of a ring that is mounted on the surface of the package board. Therefore, the electric property may be deteriorated. Therefore, in the case where a large number of wiring layers can be provided, the electric property can be improved by allotting the signal wiring on the second layer or lower but not on the first layer.

Further, with the structure where the power supply plane and the ground plane are provided adjacent to each other on the third layer and the fourth layer, a large capacity can be secured between the power supply and the ground.

Patent Document 1: Japanese Patent Unexamined Publication 2000-307005

Patent Document 2: Japanese Patent Unexamined Publication 2004-6513

However, there are following shortcomings in the above-described structure in which the signal is allotted to the FC pad in the outer peripheral part, the power supply and the ground are allotted to the inner FC pads, and the signal wiring is allotted in the second layer by disposing the power-supply/ground plane at the outer peripheral part of the LSI on the LSI mount surface.

The first shortcoming is that the signal property is deteriorated since the power-supply/ground plane on the first layer and the FC pad for the power-supply/ground of the LSI are disconnected by the signal FC pad. FIG. 4 is an enlarged view of the vicinity of the FC pads that are shown in FIG. 2. When signal current I sig is flown to the signal wiring 201 of the second layer, return currents I ret1 and I ret3 are generated in the ground plane 203 of the first layer as the upper layer thereof and the power supply plane 202 of the third layer as the lower layer. When a signal is flown between the LSI and the package board through the FC pads, the return current passes the power-supply/ground pad that is closest to the signal pad and flows between the LSI and the package board. However, the power-supply/ground plane (203) on the first layer is cut from the FC pad of the power-supply/ground in the vicinity of an end 203E of the plane. Thus, the return current flowing in the power-supply/ground plane of the first layer cannot flow directly to the FC pads of the power-supply/ground. Therefore, there generates mismatch in the characteristic impedance, thereby causing reflection of the signal or unnecessary radiation.

The second shortcoming is that the effect of decreasing the switching noise becomes insignificant since the power-supply/ground plane of the first layer and the FC pad for the power-supply/ground plane of the LSI are disconnected by the signal FC pad. In order to deal with the switching noise that is generated in accordance with an increased speed of the LSI, the package board of the related art employs a multilayer substrate, and the power supply plane and the ground plane are disposed next to each other alternately. With this, the switching noise is decreased. For further decreasing the switching noise, a chip capacitor with a high capacity is also mounted on the package board.

FIG. 5 is a cross section for showing the state of the power-supply and ground planes of the package in the vicinity of the capacitor mount area in the case where the chip capacitor is mounted. FIG. 6 is a circuit block diagram for showing the electrical action (however, the interlayer capacity between the third and fourth layers is not shown in FIG. 6). The chip capacitor 224 is connected to a power-supply-side pad 214 and a ground-side pad 215, which are provided on the first layer. The power-supply-side pad 214 is connected to the power supply plane 202 of the third layer through the interlayer connecting conductor 209h, and the ground plane 203 to which the ground-side pad 215 is provided is connected to a ground plane 204 of the fourth layer through the interlayer connecting conductor 209e. Therefore, the chip capacitor 224 is parallel-connected to the interlayer capacity between the third and fourth layers. The power supply plane 202 is connected to the power-supply FC pad 207 through the interlayer connecting conductor 209b, and the ground plane 204 is connected to the ground FC pad 206 through the interlayer connecting conductor 209a. By adjacently disposing the power supply plane and the ground plane in this manner and, in addition, by providing the chip capacitor, the switching noise has been decreased.

However, when the ground plane 203 of the first layer and the ground FC pad 206 are disconnected, the both are connected to each other through the ground plane 204 and the interlayer connecting conductors 209a, 209e, which are provided on another wiring layer. Thus, there generates inductance components La and Le of the interlayer connecting conductors parasitically between the ground side of the interlayer connecting capacity 1-3 of the first to third layers and the ground FC pad 206, and between the ground-side terminal of the chip capacitor 224 and the ground FC pad 206. As described, there are the inductance components La, Le of the interlayer connecting conductors for connecting the ground plane present in a position that is closer to the LSI chip 221 than the capacity C cap of the chip capacitor 224 and the interlayer capacities C1-C3 of the first to third layers. Therefore, it offsets the effect of the interlayer capacities C1-C3 and the chip capacitor 224 for absorbing the switching noise.

SUMMARY OF THE INVENTION

The present invention has been designed to overcome the aforementioned shortcomings of the related art. It is therefore an object of the present invention to provide a semiconductor integrated circuit package that is highly effective for decreasing the switching noise and the signal property thereof is excellent when mounting an LSI of area-array structure.

In order to achieve the aforementioned object, the present invention provides a wiring board for a semiconductor integrated circuit package, which comprises: an electronic device mount part that includes a ground plane, a power supply plane, and a signal wiring layer, and includes a wiring layer that is an electronic device mount surface in which device connecting pads are arranged in an area-array form; a surface ground plane or a surface power supply plane around the electronic device mount part; and a ground pad and a power supply pad arranged on an inner side of the electronic device mount part, wherein the ground pad or the power supply pad is connected to the surface ground plane or the surface power supply plane through a wiring of a same wiring layer.

Furthermore, in order to achieve the aforementioned object, the present invention provides a semiconductor wiring board for a semiconductor integrated circuit package, which comprises: an electronic device mount part that includes a ground plane, a power supply plane, and a signal wiring layer, and includes a wiring layer that is an electronic device mount surface in which device connecting pads are arranged in an area-array form; a surface ground plane or a surface power supply plane around the electronic device mount part; and a ground pad and a power supply pad arranged on an inner side of the electronic device mount part, wherein the surface ground plane or the surface power supply plane is formed over an entire surface, except for an opening with a device connecting pad other than the ground pad or the power supply pad, and the ground pad or the power supply pad is formed on the surface ground plane or the surface power supply plane.

With the wiring board of the present invention, it is possible to continuously flow the return current, which is generated on the power supply or ground plane formed on the surface layer, to the LSI chip, even in the case of mounting the LSI of an area-array structure. Thus, the excellent signal property can be maintained. Further, with the wiring board of the present invention, the inductance between the LSI chip and the power supply or ground plane can be decreased. With this, it enables to sufficiently realize the effect of absorbing the switching noise by the power supply or ground plane formed on the surface layer. Moreover, when a chip capacitor for noise absorption is mounted on the surface layer, the capability of this chip capacitor can be sufficiently realized.

DETAILED DESCRIPTION OF THE PREFERRED EMBODIMENTS

In the followings, embodiments of the present invention will be described in detail by referring to the accompanying drawings.

First Embodiment

Figure 1:
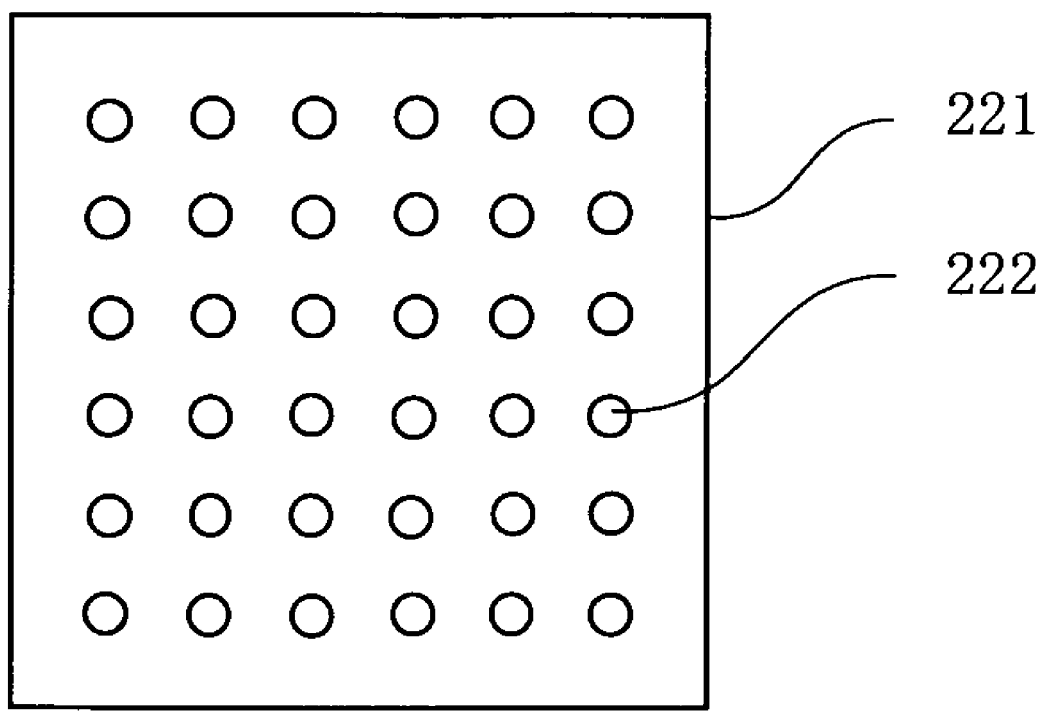
FIG. 1 is a plan view of a mount surface of a flip-chip-mount LSI chip which comprises bumps arranged in an area-array form.
Figure 2:
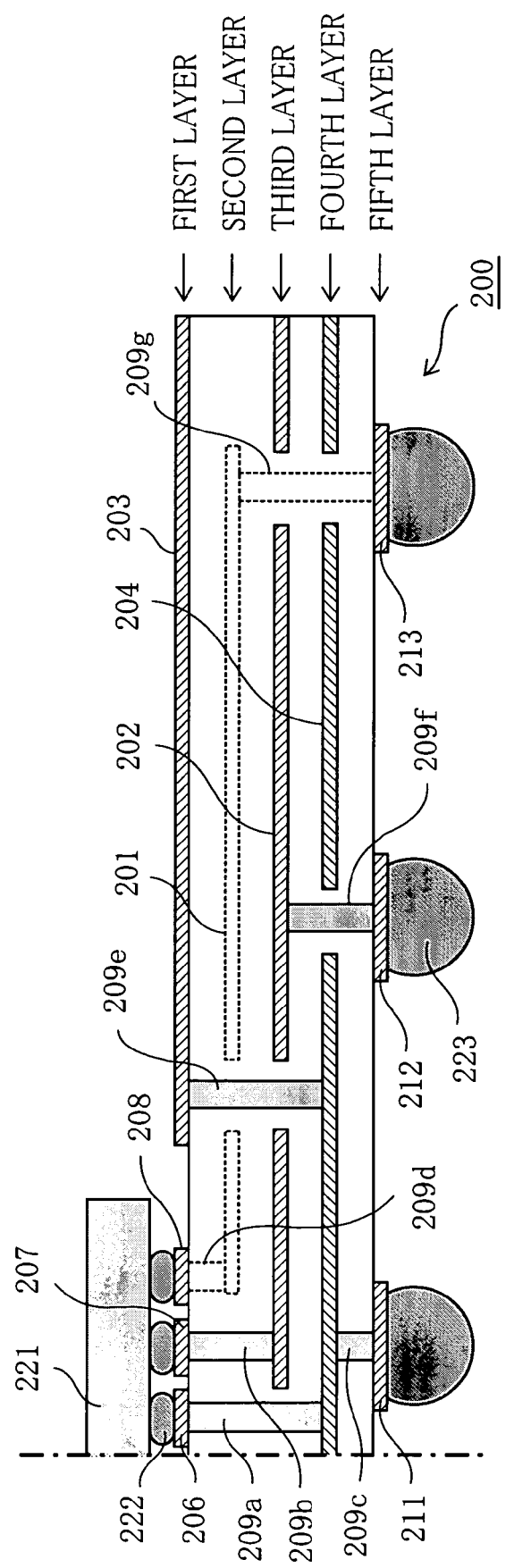
FIG. 2 is a cross section of a semiconductor integrated circuit device that is designed prior to the present invention.
Figure 3A:
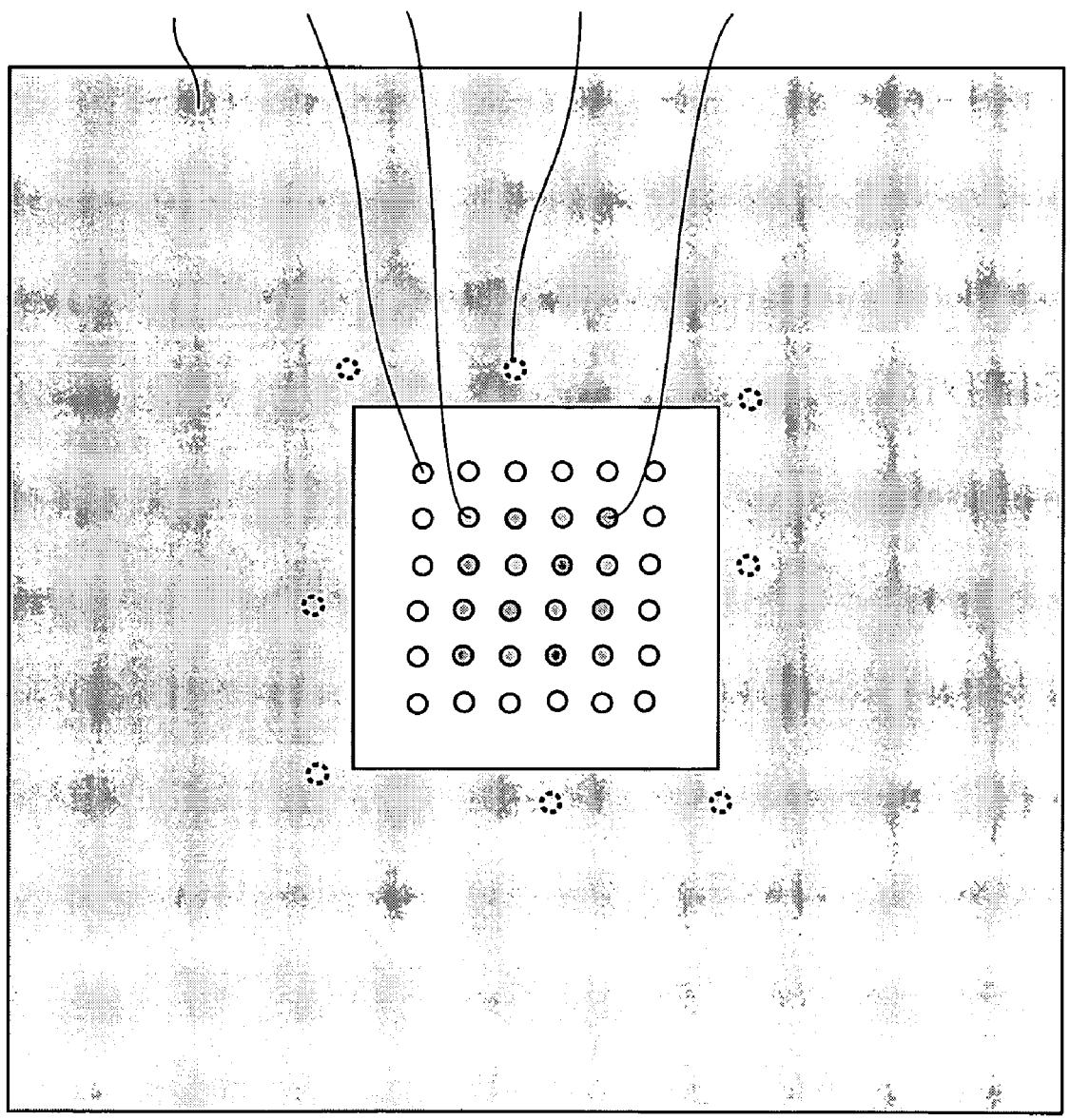
FIG. 3A is a top plan view of a wiring board for a semiconductor integrated circuit package, which is designed prior to the present invention.
Figure 3B:
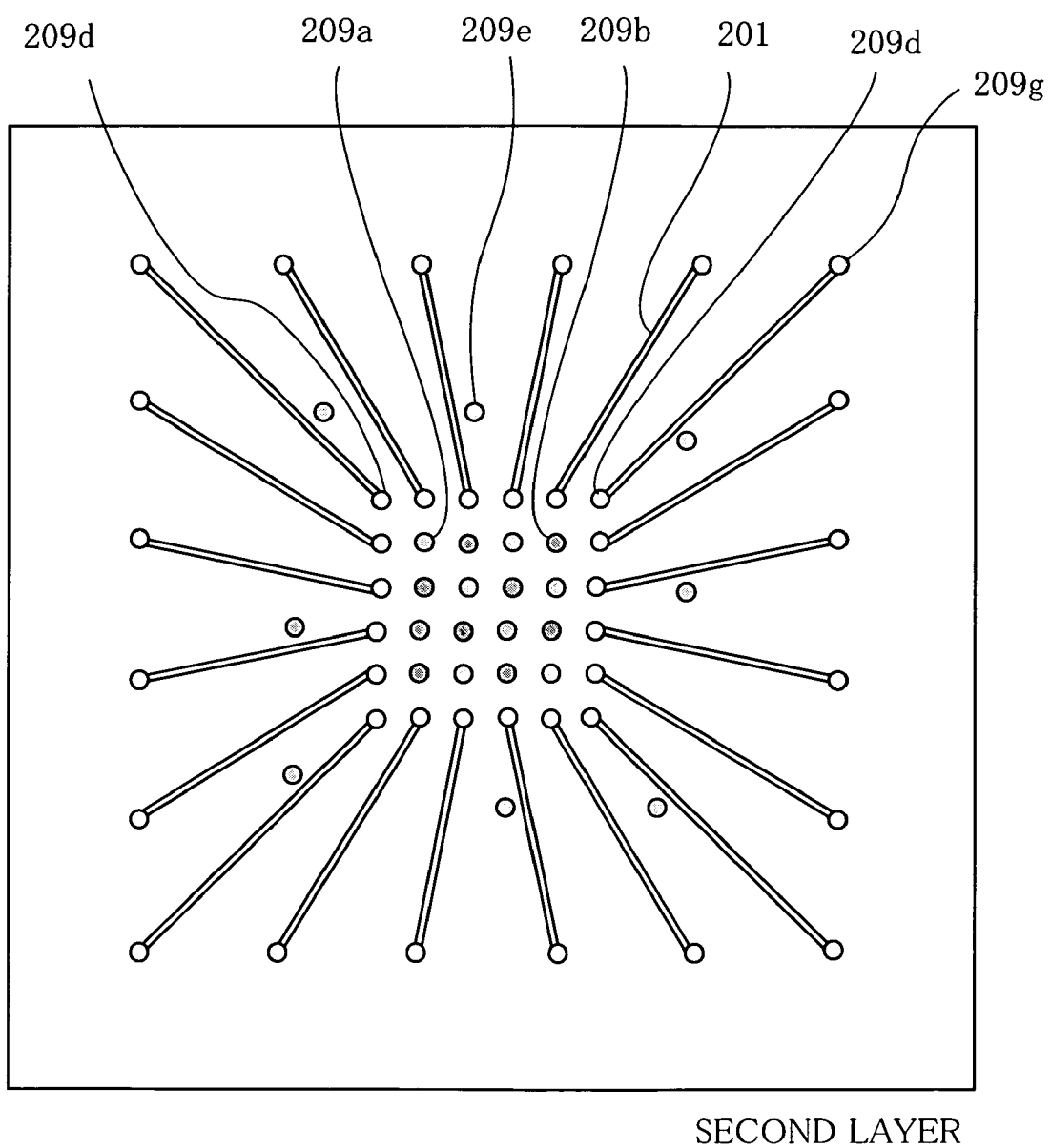
FIG. 3B is a top plan view of a second layer of the wiring board for a semiconductor integrated circuit package, which is designed prior to the present invention.
Figure 3C:
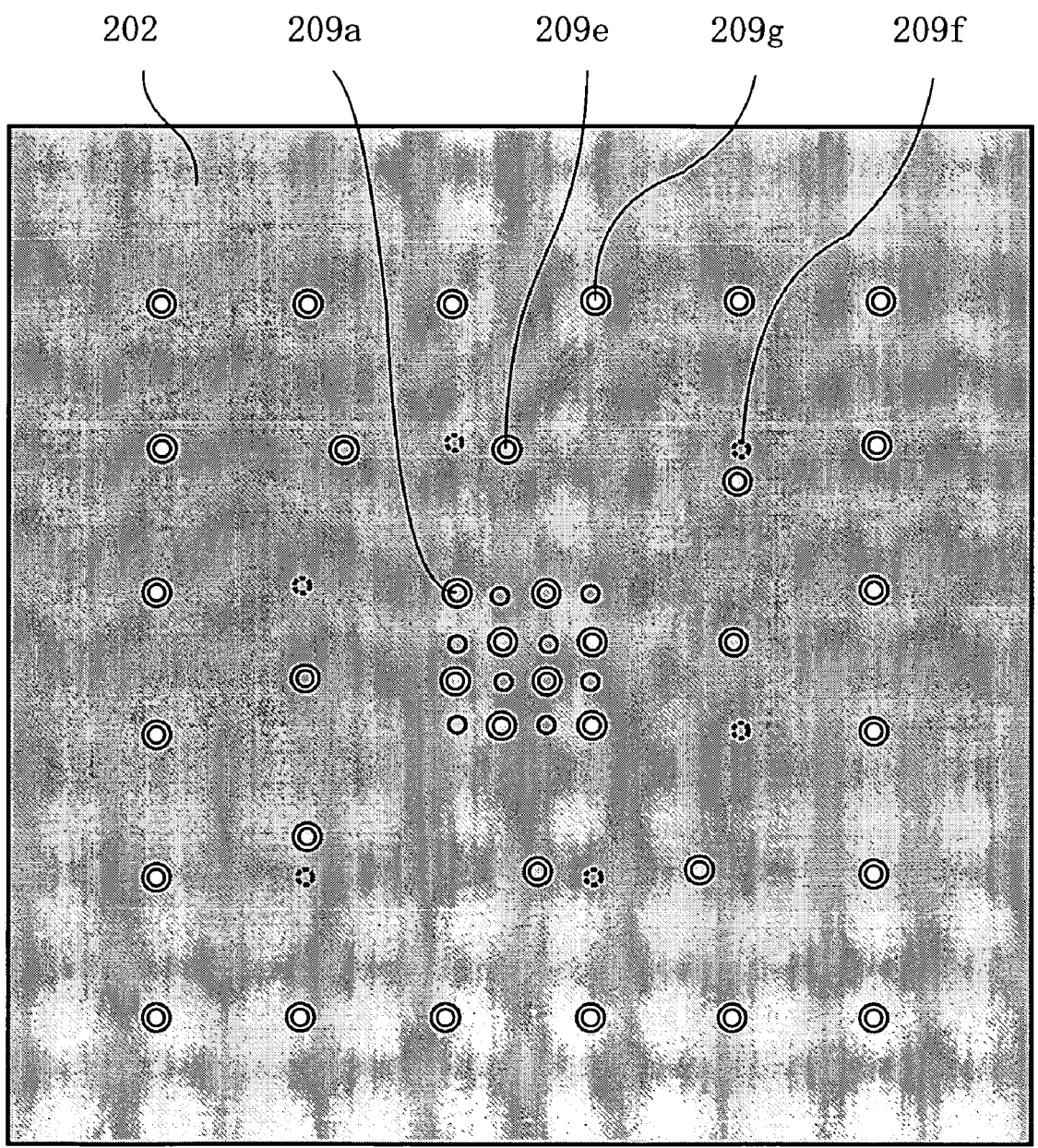
FIG. 3C is a top plan view of a third layer of the wiring board for a semiconductor integrated circuit package, which is designed prior to the present invention.
Figure 3D:
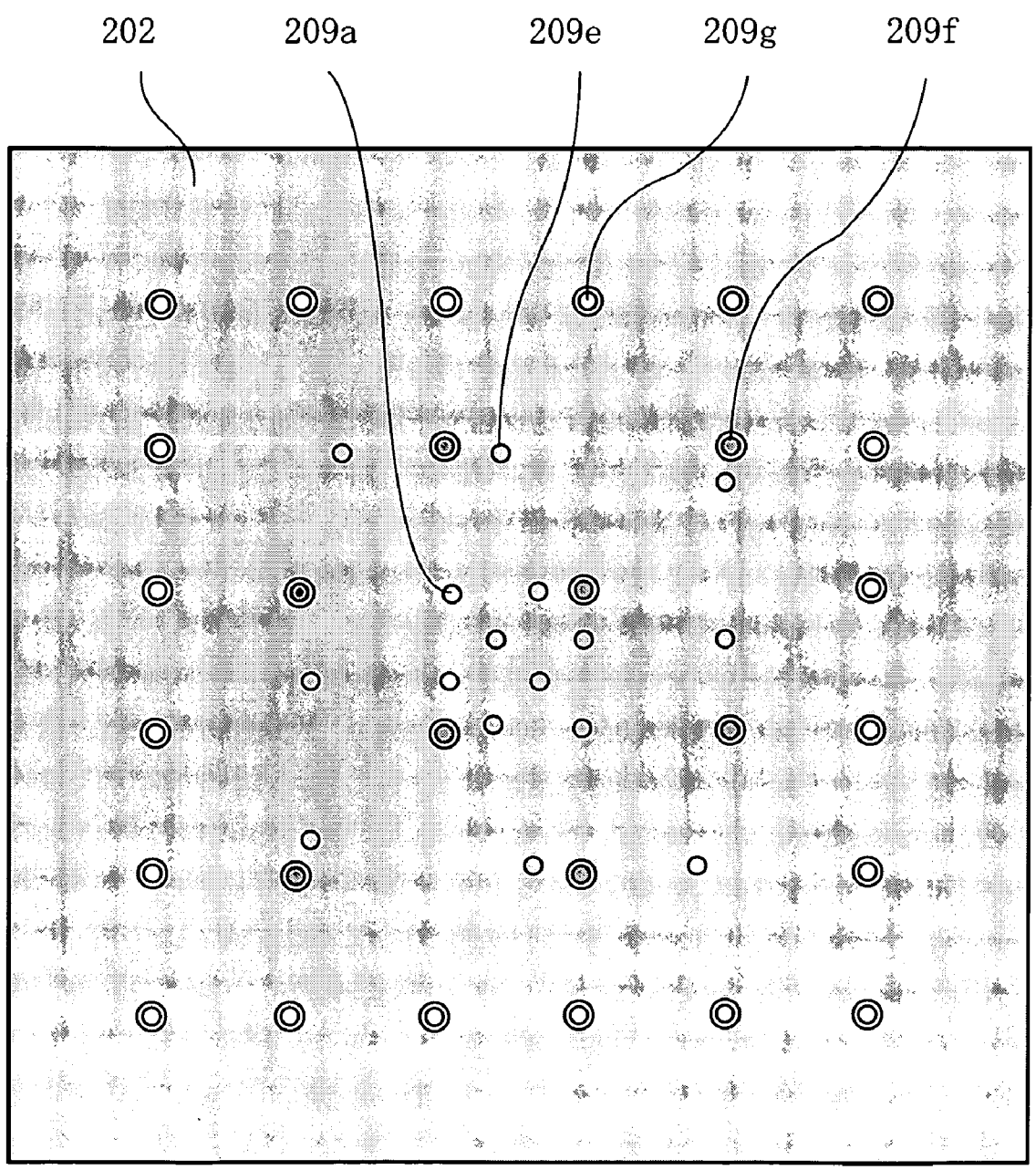
FIG. 3D is a top plan view of a fourth layer of the wiring board for a semiconductor integrated circuit package, which is designed prior to the present invention.
Figure 3E:
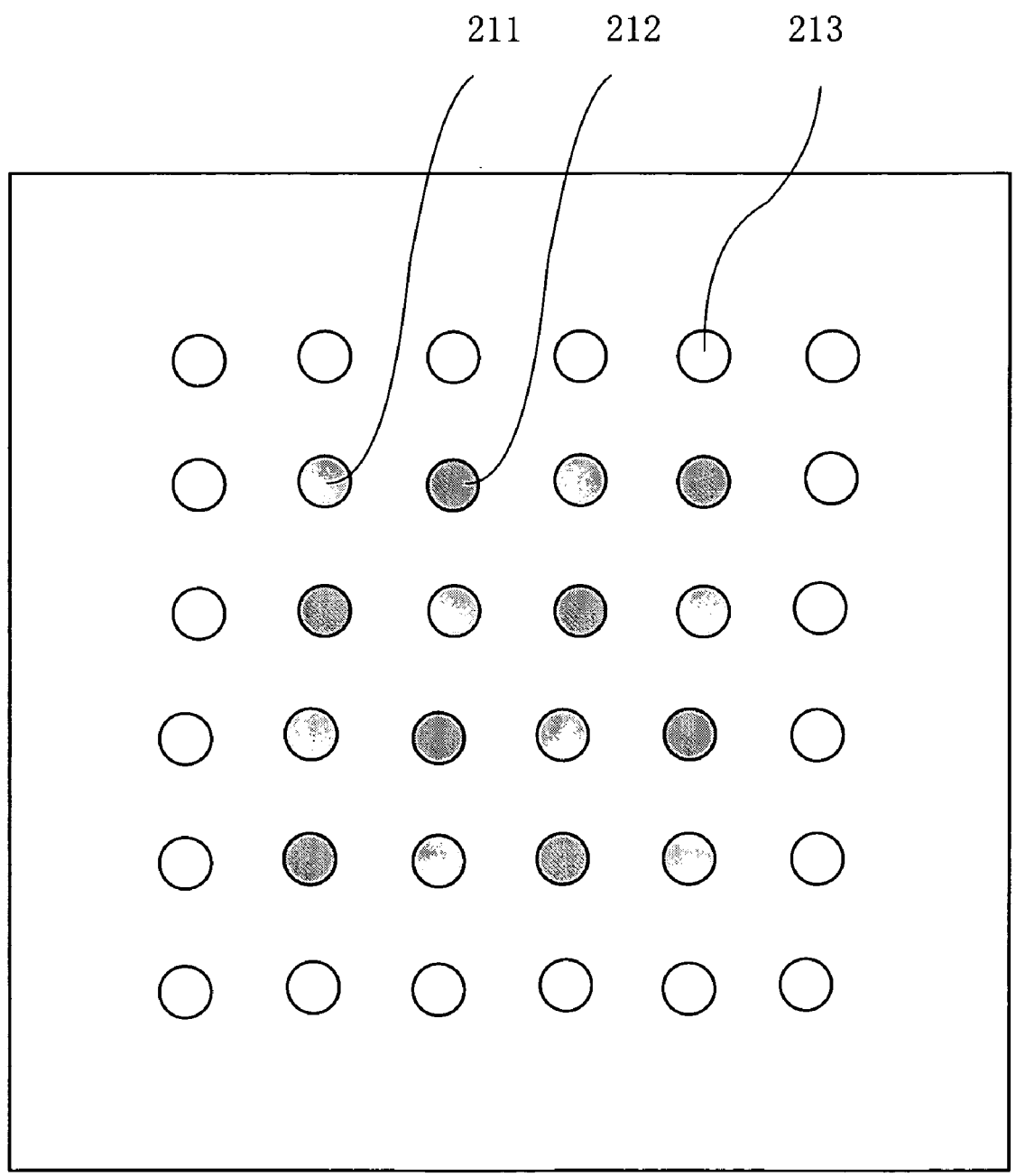
FIG. 3E is a top plan view of a fifth layer of the wiring board for a semiconductor integrated circuit package, which is designed prior to the present invention.
Figure 4:
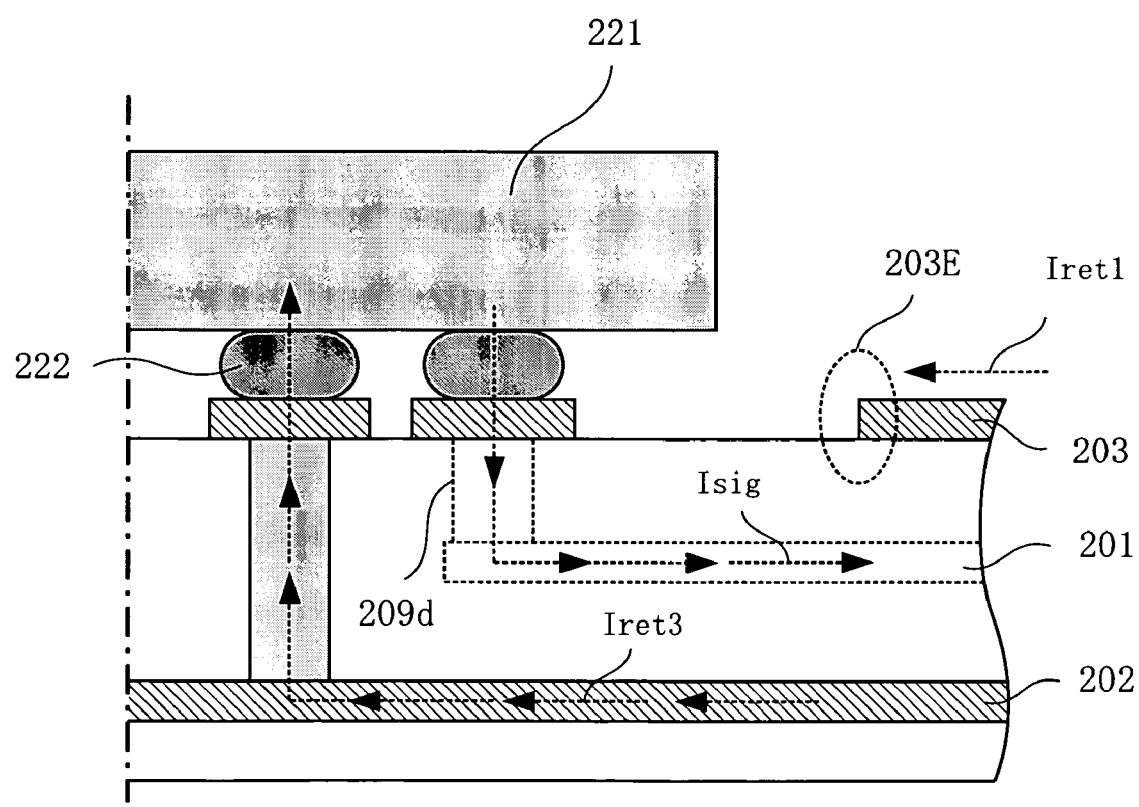
FIG. 4 is an illustration for describing action regarding the return current of the semiconductor integrated circuit device that is designed prior to the present invention.
Figure 5:
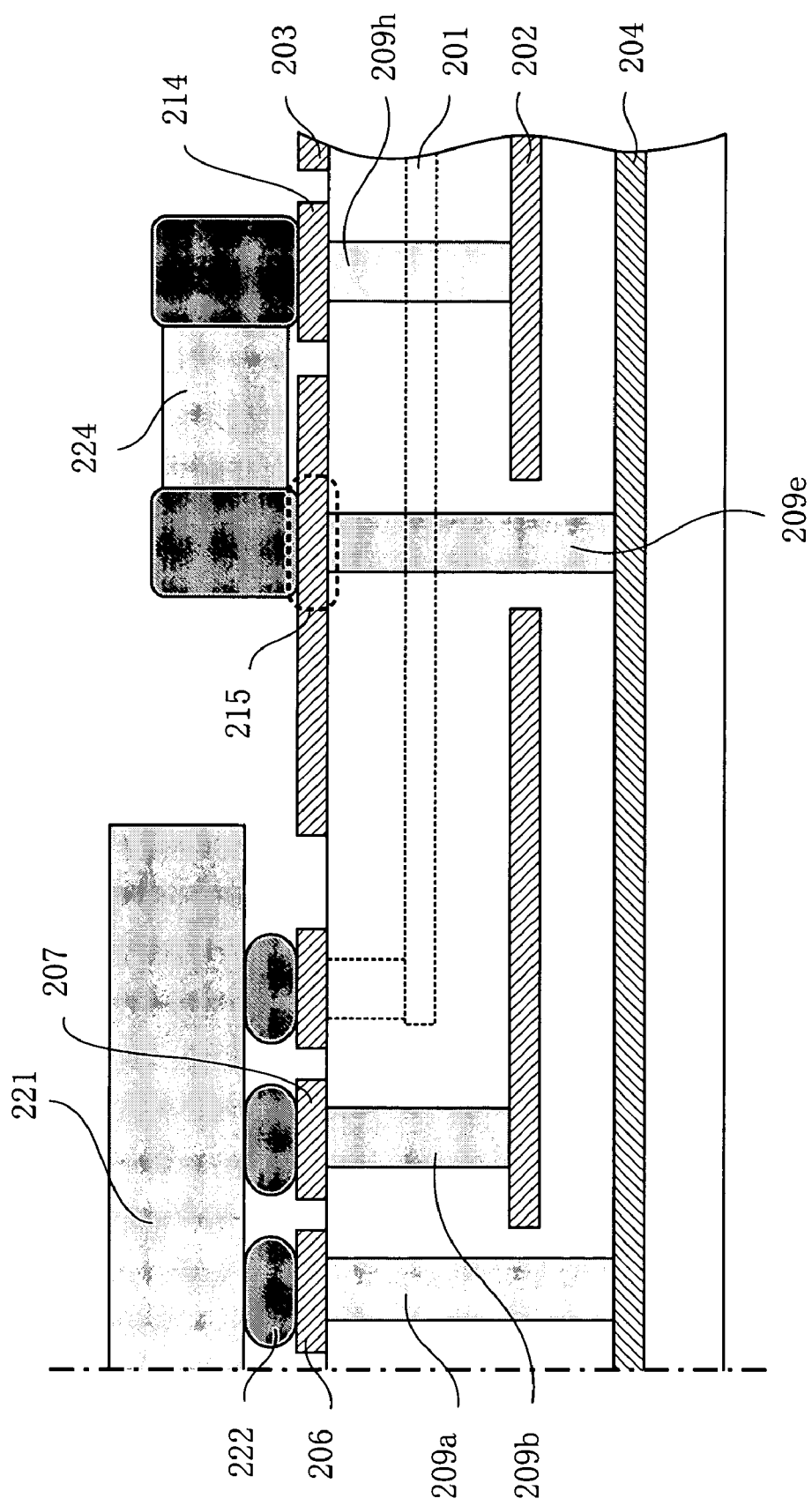
FIG. 5 is a cross section of the semiconductor integrated circuit device of the prior art to which a chip capacitor is mounted.
Figure 6:
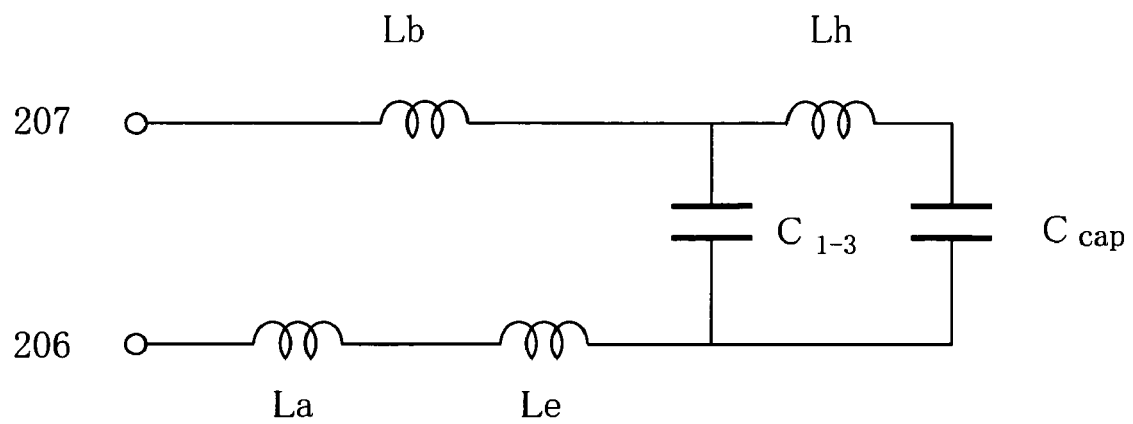
FIG. 6 is a circuit block diagram for showing the electrical action of the semiconductor integrated circuit device of the prior art to which a chip capacitor is mounted.
Figure 7:
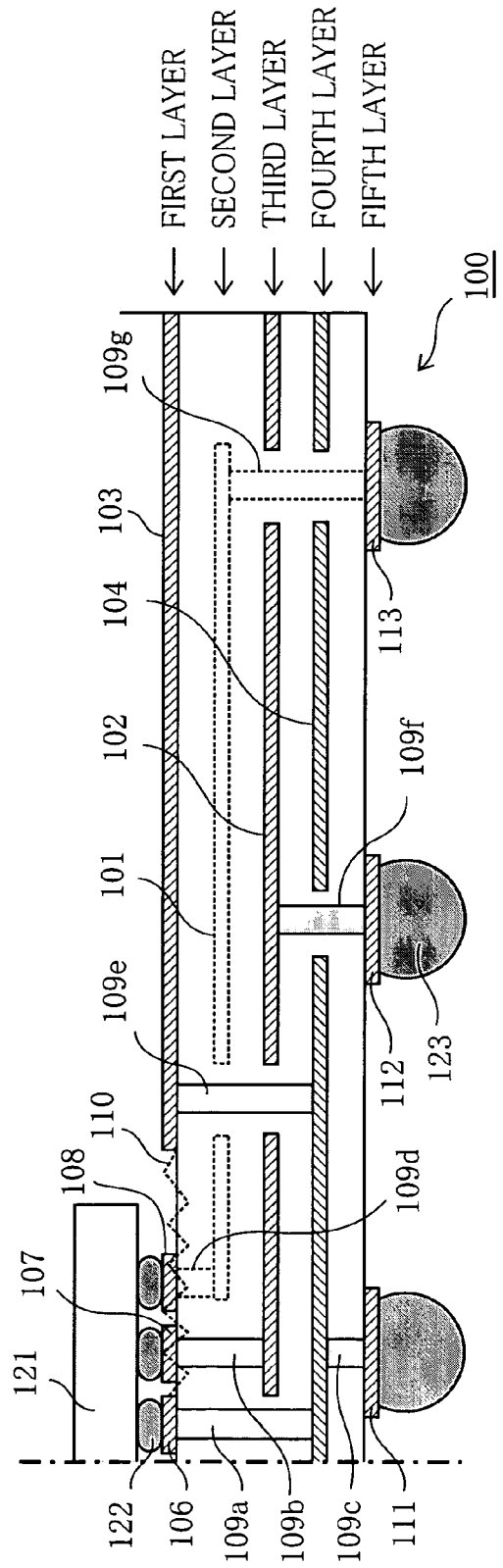
FIG. 7 is cross section of a semiconductor integrated circuit device according to a first embodiment of the present invention.

FIG. 7 is a cross section of the semiconductor integrated circuit package according to a first embodiment of the present invention. The basic structure is the same as the package board of the conventional case shown in FIG. 2. A semiconductor package board 100 is a substrate comprising five wiring layers. The first layer to which an LSI chip is mounted is provided with FC pads 106-108 and a ground plane 103 for mounting the LSI. The second layer is provided with a signal line 101, the third layer with a power supply plane 102, the fourth layer with a ground plane 104, and the fifth layer with lands 111-113 for disposing a solder ball 123. A power supply FC pad 107 of the first layer is connected to the power supply plane 102 of the third layer through an interlayer connecting conductor 109b, and a signal FC pad 108 is connected to the signal line 101 of the second layer through an interlayer connecting conductor 109d. The ground FC pad 106 of the first layer is connected to the ground plane 104 of the fourth layer through an interlayer connecting conductor 109a, the ground plane 104 of the fourth layer and the ground plane 103 of the first layer are connected through an interlayer connecting conductor 109e and, further, the ground FC pad 106 and the ground plane 103 are connected through a connecting wiring 110. Thereby, each ground net comes to have the same potential. It is different from the package board of the conventional case in respect that, in the first layer, there is provided the connecting wiring 110 between the ground plane 103 and the ground FC pad 106.

Figure 8:
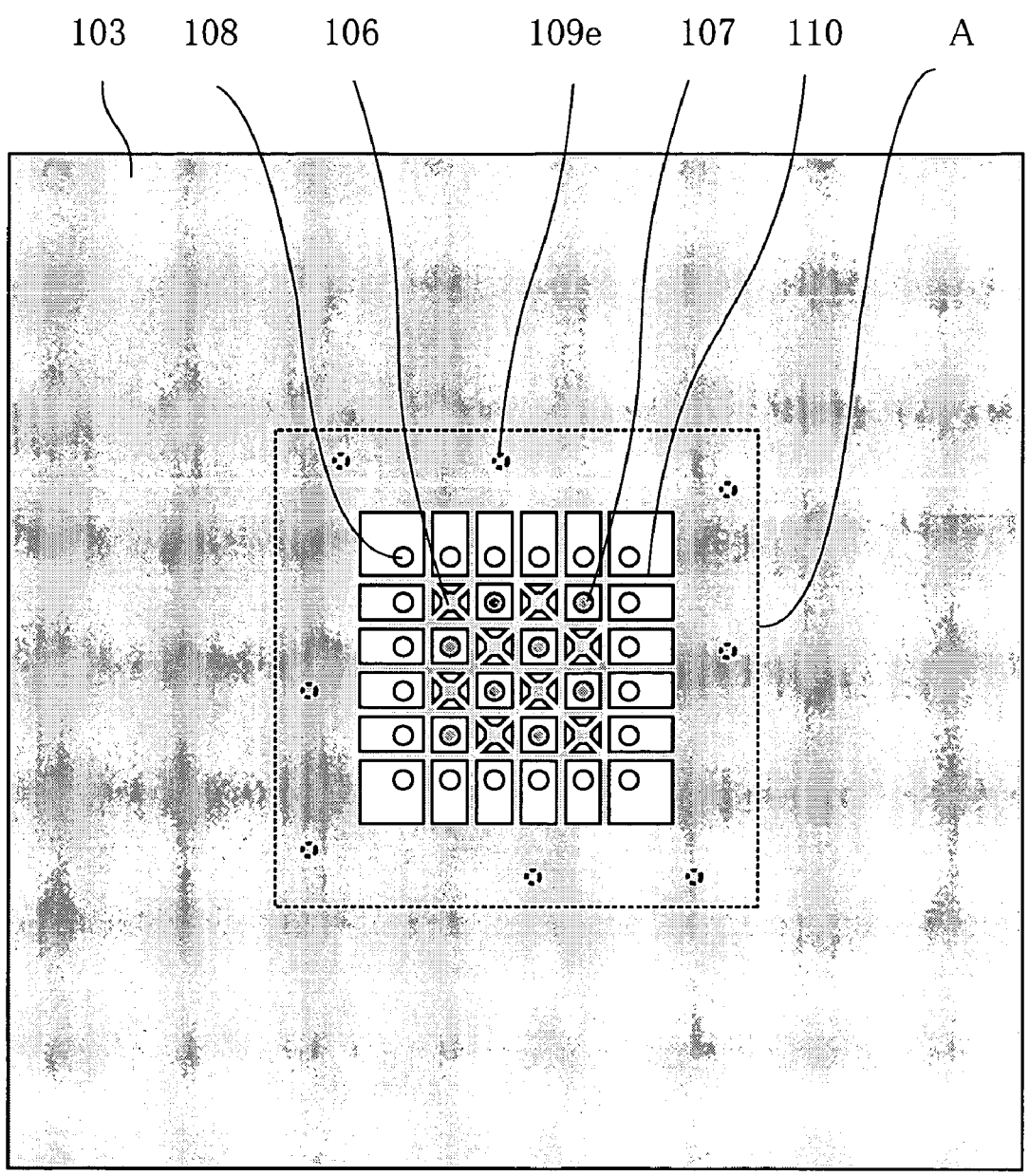
FIG. 8 is a top plan view of a wiring board for a semiconductor integrated circuit package according to the first embodiment of the present invention.

The forms of the second to fifth layers of this package board is the same as that of the conventional case shown in FIG. 3A-FIG. 3E. FIG. 8 shows the top plan view of the first layer. There are FC pads in the center for mounting the LSI chip, and the ground plane 103 is extended around thereof.

Figure 9:
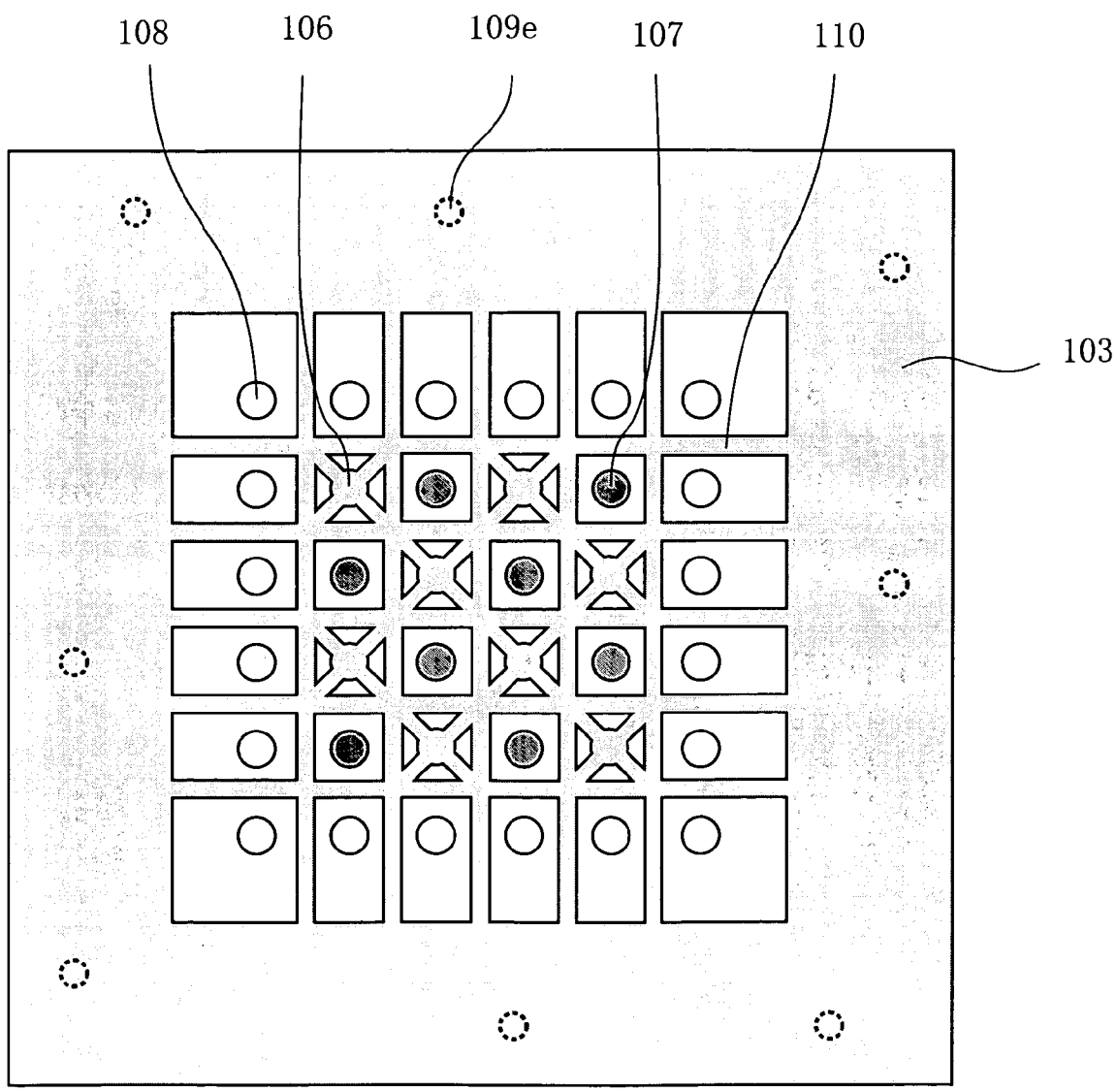
FIG. 9 is an enlarged view of the center part of FIG. 8.

FIG. 9 shows an enlarged view of the center part A of the first layer where the FC pads are formed. The pad in the outermost among the FC pads lined in six rows and six columns is allotted to the signal FC pad 108, and the pads on the inner side are used as the ground FC pad 106 and the power supply FC pad 107. There is the ground plane 103 present around the FC pads, and the ground plane 103 is connected to the ground plane of the fourth layer through the interlayer connecting conductor 109e. The ground FC pad 106 and the ground plane 103 around thereof are connected through the connecting wiring 110.

Figure 10:
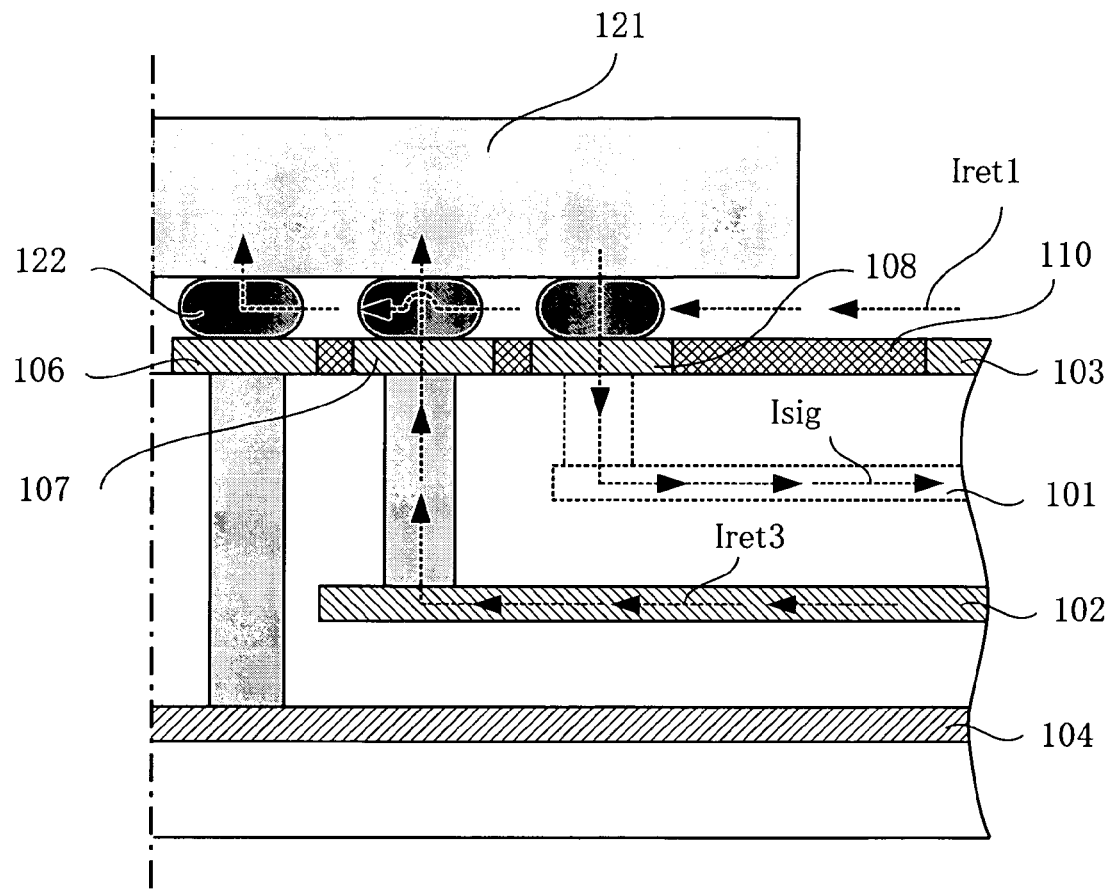
FIG. 10 is an illustration for showing the electrical action of the semiconductor integrated circuit device according to the first embodiment of the present invention.
Figure 11:
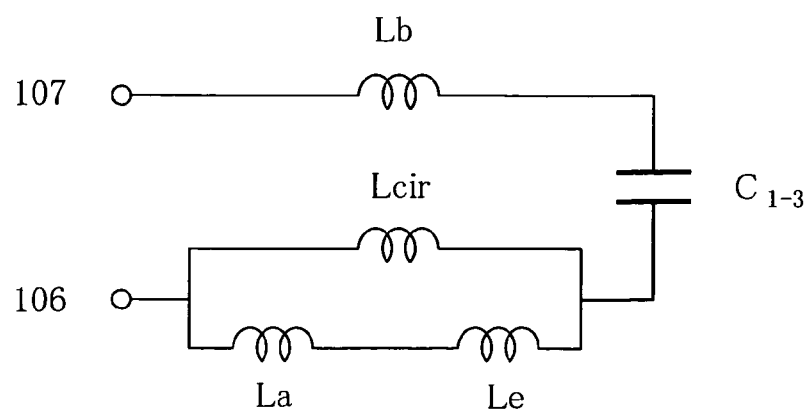
FIG. 11 is a circuit block diagram for showing the electrical action of the wiring board for a semiconductor integrated circuit package according to the first embodiment of the present invention.

Next, the electrical action of the connecting wiring 110 will be described by referring to FIG. 10 and FIG. 11. As the electrical effects of the connecting wiring, there are the effect regarding the continuity of the return current and the effect regarding absorption of the switching noise.

First, there is described the continuity of the return current. FIG. 10 is a model illustration of the electric current path. When signal current I sig is flown to the signal wiring 101 of the second layer, return currents I ret1 and I ret3 are generated in the ground plane 103 of the first layer that is above the second layer and in the power supply plane 102 on the third layer that is below the second layer. In the vicinity of the FC pads on the first layer, the ground FC pad 106 and the ground plane 103 are connected through the connecting wiring 110. Thus, the return current I ret1 flowing in the first layer flows into the LSI chip by going through the connecting wiring, the ground FC pad 106, and the bumps. As described, the ground plane and the ground FC pad are electrically connected even in the vicinity of the FC pads so that the return current flowing in the first layer is not to be disconnected. Thereby, mismatch of the characteristic impedance at the end of the plane can be suppressed as small. Thus, reflection of the signal and generation of unnecessary radiation can be suppressed.

Next, the effect of absorbing the switching noise will be described. FIG. 11 is a circuit block diagram for showing the connection between the planes. The interlayer capacities C1-3 are generated between the ground plane 103 of the first layer and the power supply plane 102 of the third layer. The capacities have the effect of absorbing the switching noise. However, if there is an inductance component present between the capacities and the LSI, the effect of noise absorption is deteriorated. Looking into the path on the ground side of this embodiment, the ground side of the capacities C1-3 and the ground FC pad 106 are connected through two paths, one of which is a path going through the connecting wiring 110 and the other is a path going through the ground plane of the fourth layer. There is inductance L cir of the connecting wiring generated in the path that passes through the connecting wiring 110. There are two inductances generated in the path that passes through the ground plane of the fourth layer, one of which is the inductance La of the interlayer connecting conductor 109a and the other is the inductance Le of the interlayer connecting conductor 109e. Those three inductances are connected in such a manner that the series inductors of the inductances La and Le become in parallel with the inductor of the inductance L cir. In general, when the inductors are connected in parallel, the inductance becomes smaller than the case where each inductor is connected individually. In addition, if the values of those inductors are largely different, the smaller inductance becomes dominant. In this embodiment, the small-value inductance L cir is added by providing the connecting wiring. Thus, the inductance is largely decreased than the case where there are only the inductances La and Le. As described, by providing the connecting wiring in the first layer, it enables to suppress deterioration of the effect of absorbing the switching noise by the capacities, which is caused by the parasitic inductance of the interlayer connecting conductors.

The package board 100 of this embodiment can be manufactured by using a generally used manufacturing method with a generally used substrate material. For example, used as the substrate materials may be an organic material (epoxy, polyimide, fluororesin, polyphenylene ether (PPE) resin, phenol resin, etc) or insulating materials such as ceramic, glass, composite material, and the like. The wiring pattern of each layer can be formed using a technique such as etching, printing, or the like. Further, the interlayer connecting conductor is formed by making a hole on the insulating material through laser irradiation or drill processing and then making it electrically conductive by filling metal paste or by plating, etc.

MODIFICATION EXAMPLE

Figure 12:
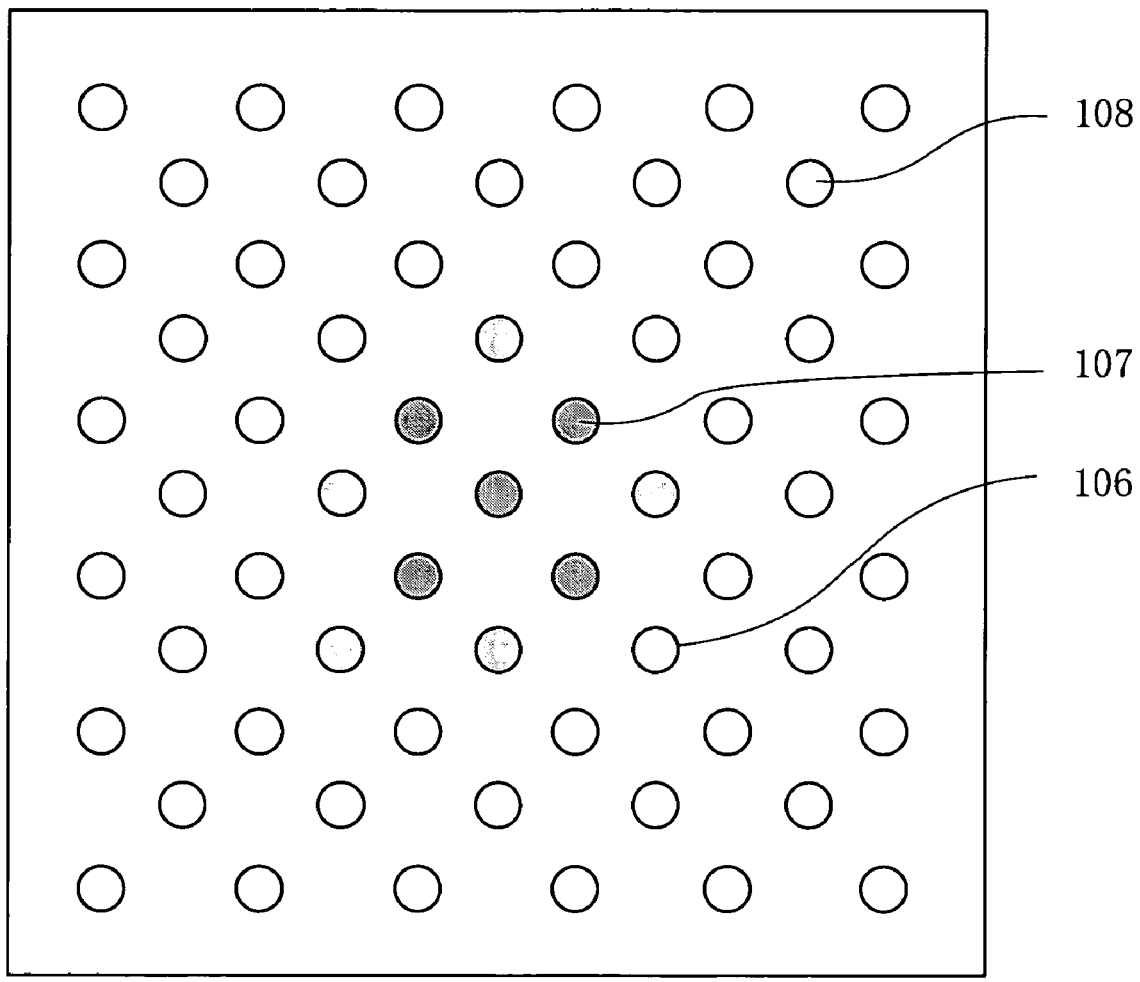
FIG. 12 is a top plan view for showing an LSI-chip mount part of a wiring board for a semiconductor integrated circuit package according to a modification example of the first embodiment of the present invention.
Figure 13:
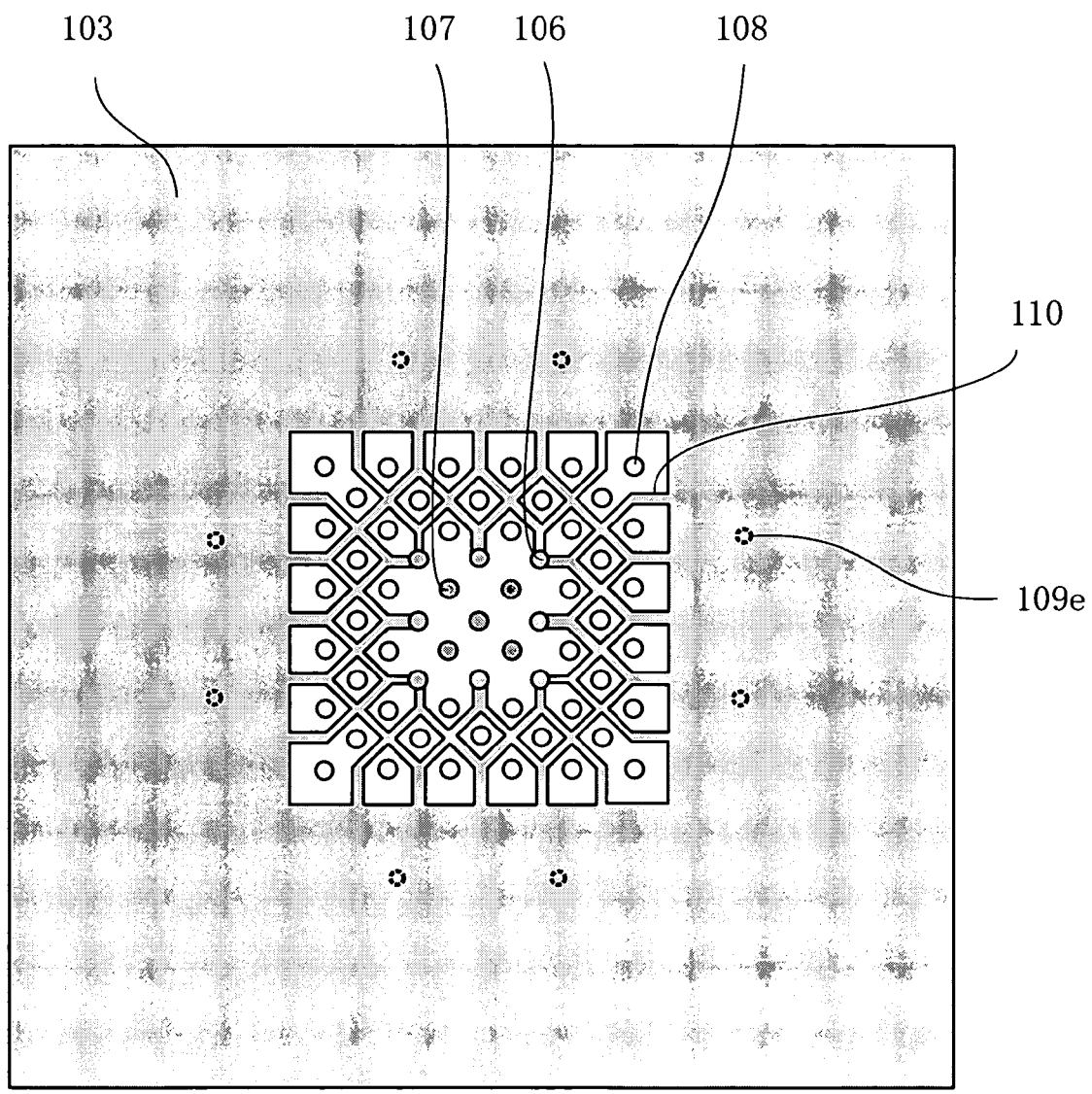
FIG. 13 is a top plan view of the wiring board for a semiconductor integrated circuit package according to the modification example of the first embodiment of the present invention.

A modification example of this embodiment will be described. In the first embodiment, the FC pads are arranged orthogonally in the horizontal and vertical directions. However, the present invention can be applied to other cases where the FC pads are arranged in other forms. As an example, there is illustrated, as in FIG. 12, the case of pad arrangement where the FC pads are lined while rotated by 45° with respect to the horizontal direction. FIG. 12 shows the case of the FC pads for mounting the LSI chip having sixty-one pins, in which the pads of three rows on the outer side are the signal FC pads 108, the pads on the fourth rows from the outermost, which is the inner side of the third row, are the ground FC pads 106, and the pads in still inner side are the power supply FC pads 107. FIG. 13 shows the wiring pattern in which the ground plane 103 is provided around the FC pads, and the ground FC pads 106 and the ground plane 103 formed on the inner side of the FC pad group are connected through the connecting wiring 110. By electrically connecting the ground plane and the ground FC pads by the connecting wiring in this manner, it is possible to flow the return current flowing on the ground plane to the FC pads continuously through the same wiring layer. Thus, the signal property can be maintained as excellent. Further, the effect of noise absorption by the ground plane 103 can be sufficiently realized.

In the case shown in FIG. 7, there is no connecting wiring 110 provided on the inner side than the ground FC pad s106. However, this connecting wiring may be extended between the power supply FC pads 107, and the adjacent ground FC pads 106 may be connected to each other through the connecting wiring.

Second Embodiment

Figure 14:
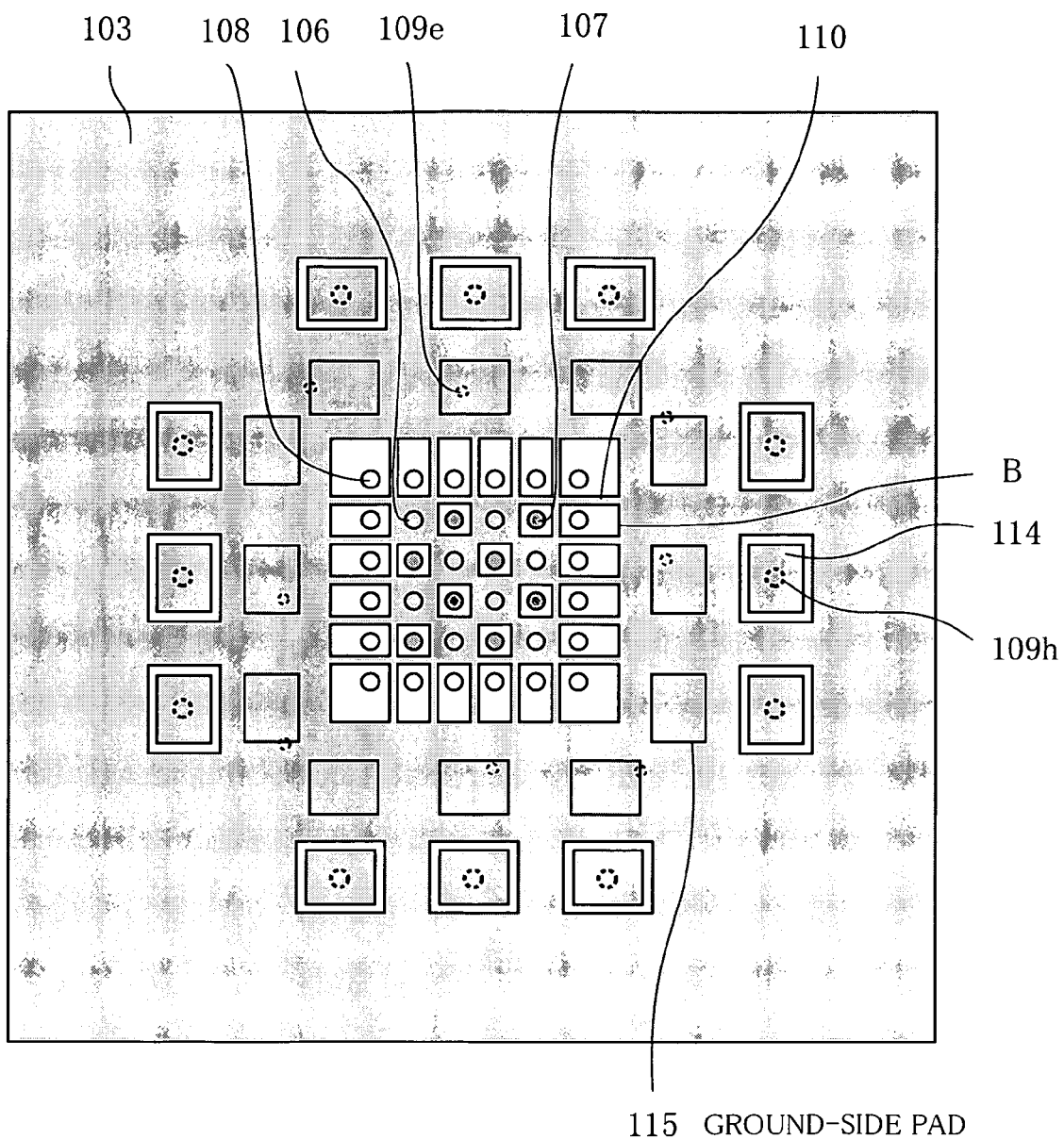
FIG. 14 is a top plan view of a wiring board for a semiconductor integrated circuit package according to a second embodiment of the present invention.

Next, a second embodiment of the present invention will be described. This embodiment regards to a semiconductor package in which a chip capacitor is mounted next to the LSI chip. The package board of this embodiment is constituted with five wiring layers. FIG. 14 shows the top plan view of the first layer. In addition, the second to fifth layers of this embodiment are the same as those of the package board of the first embodiment.

In FIG. 14, the pattern of FC-pad forming part B is the same as that of the first embodiment except that the ground FC pads 106 are formed in consecutive conductive patterns. Thus, it has almost the same functions so that the description thereof will be omitted. In FIG. 14, reference numeral 114 is a power-supply-side pad for mounting the chip capacitor, which is provided by being insulated from the ground plane 103 in an opening formed on the ground plane 103, and 115 is a ground-side pad for mounting the chip capacitor, which is provided on the ground plane 103. There are a plurality of pads 114 and 115 for mounting the chip capacitor provided around the FC pads by surrounding the LSI chip. The power-supply-side pad 114 is connected to the power supply plane of the second layer through the interlayer connecting conductor 109h.

Figure 15:
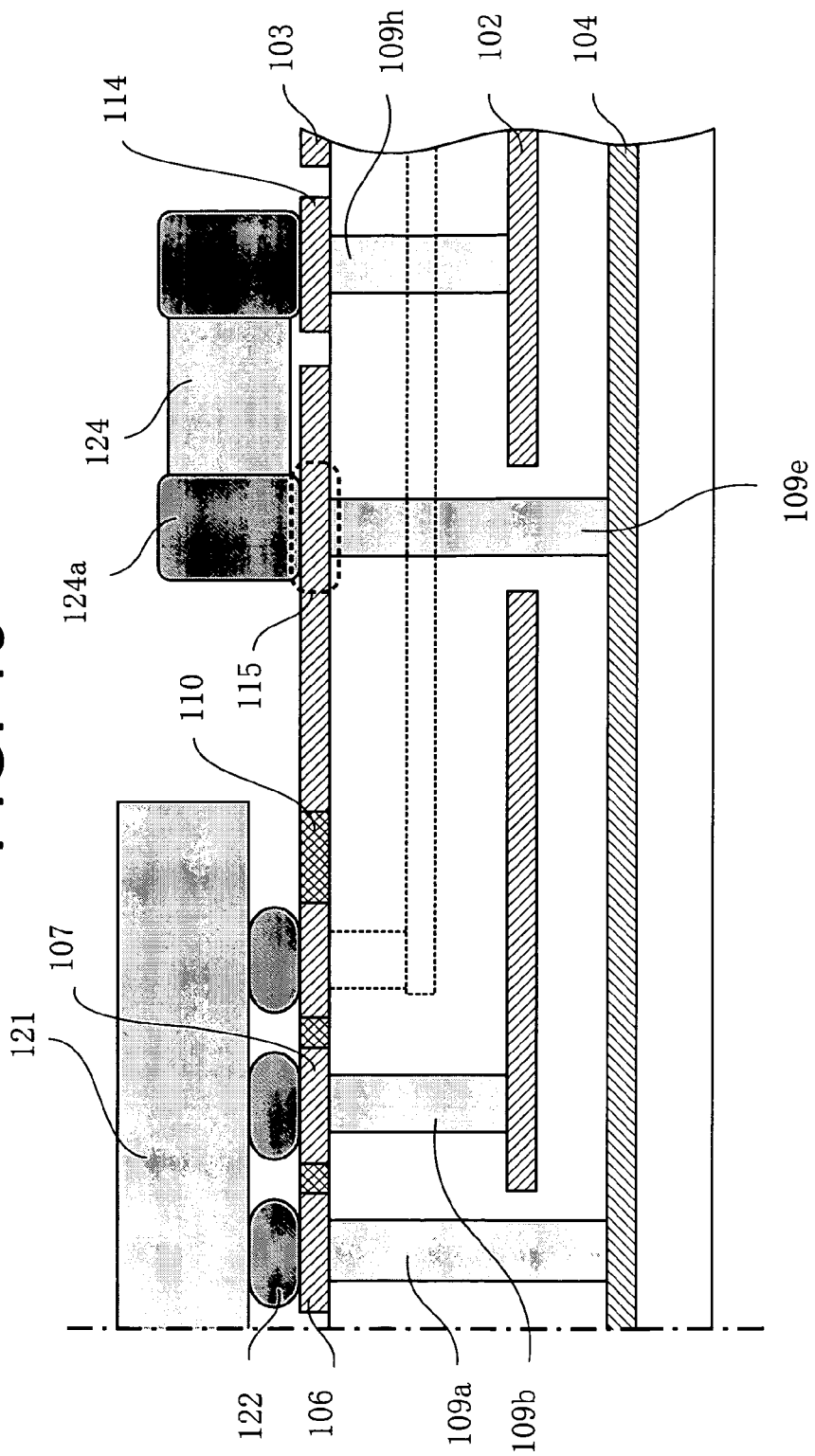
FIG. 15 is a cross section of the main part of the semiconductor integrated circuit device according to the second embodiment of the present invention.

FIG. 15 is cross section of the main part for showing the package structure according to this embodiment. A chip capacitor 124 is mounted next to an LSI chip 121 that is mounted on the surface of the substrate. The ground FC pad 16 and the ground plane 104 provided on the fourth layer are connected through the interlayer connecting conductor 109a, and the ground plane 104 of the fourth layer and the ground plane 103 of the first layer are connected through the interlayer connecting conductor 109e. Similarly, the power supply FC pad 107 and the power supply plane 102 provided on the third layer are connected through the interlayer connecting conductor 109b. One of the ends (ground-side terminal 124a) of the chip capacitor 124 is connected to the ground-side pad 115 that is provided within the ground plane 103, and the other terminal is connected to the power-supply-side pad 114. The power-supply-side pad 114 is connected to the power supply plane of the third layer through the interlayer connecting conductor 109h. As described, the chip capacitor 124, electrically, is inserted between the power supply and the ground. The ground plane 103 and the ground FC pad 106 are connected through the connecting wiring 110.

Figure 16:
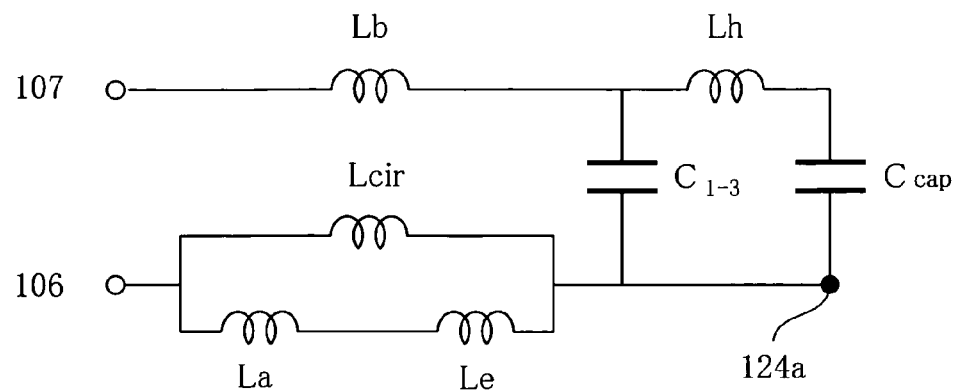
FIG. 16 is a circuit block diagram for showing the electrical action of the semiconductor integrated circuit device according to the second embodiment of the present invention.

The electrical function of this embodiment regarding the absorption of the switching noise will be described by referring to FIG. 16. In FIG. 16, reference numeral C1-3 means the interlayer capacities between the ground plane 103 of the first layer and the power supply plane 102 of the third layer, and C cap is the capacity of the chip capacitor. La is the inductance of the interlayer connecting conductor 109a and Le is the inductance of the interlayer connecting conductor 109e. L cir is the inductance of the connecting wiring 110. By providing the connecting wiring 110, the path for connecting the ground FC pad 106 and the ground-side terminal 124a of the chip capacitor 124 can be increased, thereby reducing the inductance therebetween. Further, the path that directly goes through the first layer is shorter spatially and electrically than the path that goes through the ground plane of the fourth layer via the interlayer connecting conductor. Therefore, the inductance L cir of the connecting wiring that goes through the first layer is smaller than the inductance (La+Le) of the path that goes through the fourth layer. Accordingly, the influence of the inductances La and Le of the interlayer connecting conductors is decreased. That is, by inserting the inductance L cir, the inductances between the FC pad 106 and the terminal 124a shown in FIG. 16 are significantly decreased.

As described, by providing the connecting wiring 110, it is possible to significantly decrease the parasitic inductances between the ground terminal of the LSI and the ground terminal of the chip capacitor. Therefore, the effect of absorbing the switching noise by the interlayer capacities C1-3 and the chip capacitor 124 can be sufficiently realized.

Third Embodiment

Next, a third embodiment of the present invention will be described. In the first embodiment, for the connecting wiring, there is used a wiring with uniform wiring width that is the same width as that of the signal wiring. However, the type of the connecting wiring is not limited to this. It may be in any forms as long as it is in a wiring pattern that has a function of electrically connecting the ground FC pads and the ground plane formed around thereof or the power supply FC pads and the power supply plane around thereof. This embodiment illustrates the case where a plane-type wiring is used as the connecting wiring but not the type of signal wiring used in the first embodiment.

Figure 17:
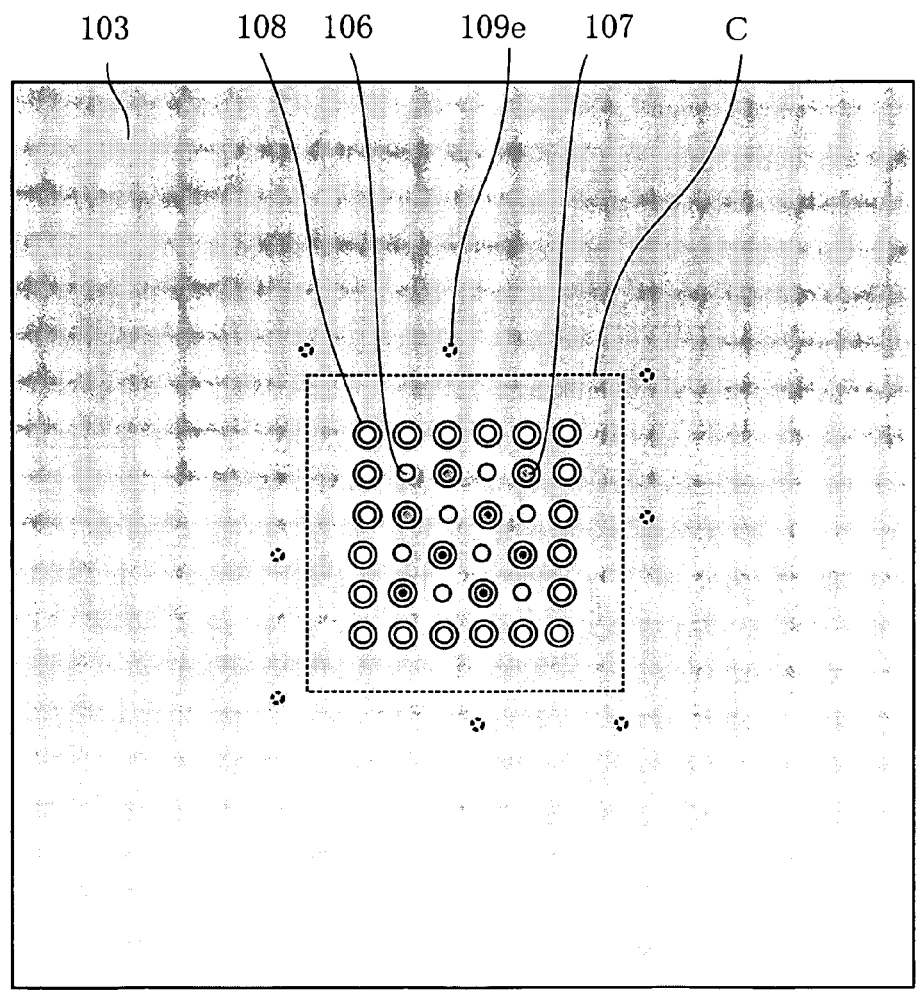
FIG. 17 is a top plan view of a wiring board for a semiconductor integrated circuit package according to a third embodiment of the present invention.
Figure 18:
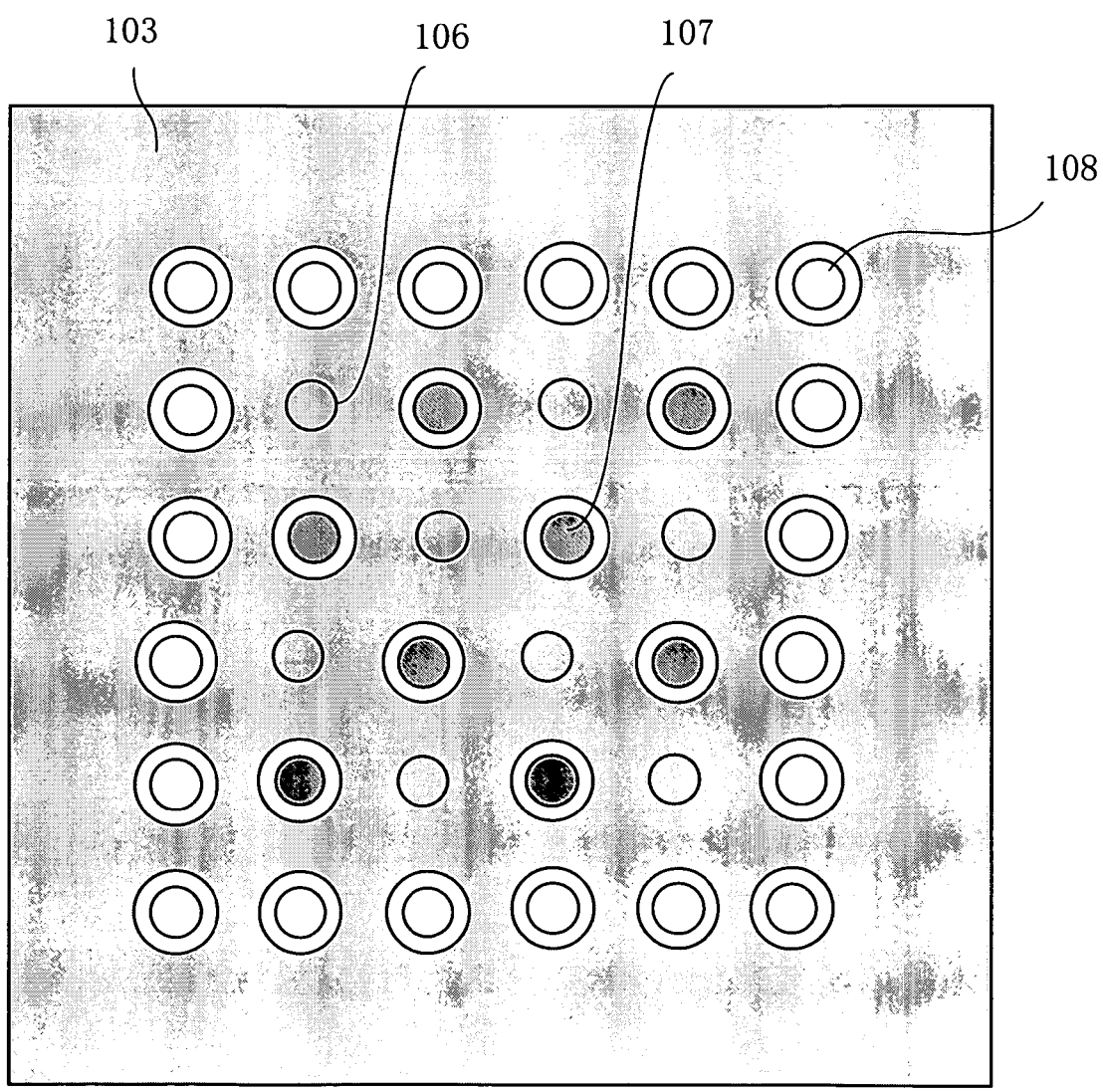
FIG. 18 is an enlarged view of the center part of FIG. 17.

The package board of this embodiment is the package board of the first embodiment but with a modified first layer, in which the pattern forms of the second to fifth layer and the arrangement/shape of the via hole are the same as the case of the first embodiment. FIG. 17 shows the top plan view of the first layer of this embodiment. The ground plane 103 is formed in a shape that covers almost the entire surface, and FC pads for mounting the LSI chip are provided in the center thereof. FIG. 18 shows an enlarged view of the center part C that is surrounded by a dotted line. Among the FC pads lined in 6×6, the signal FC pads 108 on the outer peripheral part and the power supply FC pad 107 on the inner side are provided in the openings that are formed on the ground plane 103. However, the ground FC pads 106 are disposed on the ground plane 103.

As described above, the ground plane 103 is spread over to the area where the FC pads are formed in an area-array form for electrically connecting the ground plane and the ground FC pads. By providing such plane-type connecting wiring, disconnection of the return current can be suppressed by the same action as that of the first embodiment. Thus, the noise absorption effect by the ground plane 103 that is provided on the first layer can be effectively realized. The thicker and shorter the connecting wiring is, the smaller the inductance component of the connecting wiring becomes. With this, the noise absorption effect can be increased. Therefore, the plane-type connecting wiring of this embodiment is more preferable than the connecting wiring in the wiring form of the first embodiment.

MODIFICATION EXAMPLE

Figure 19:
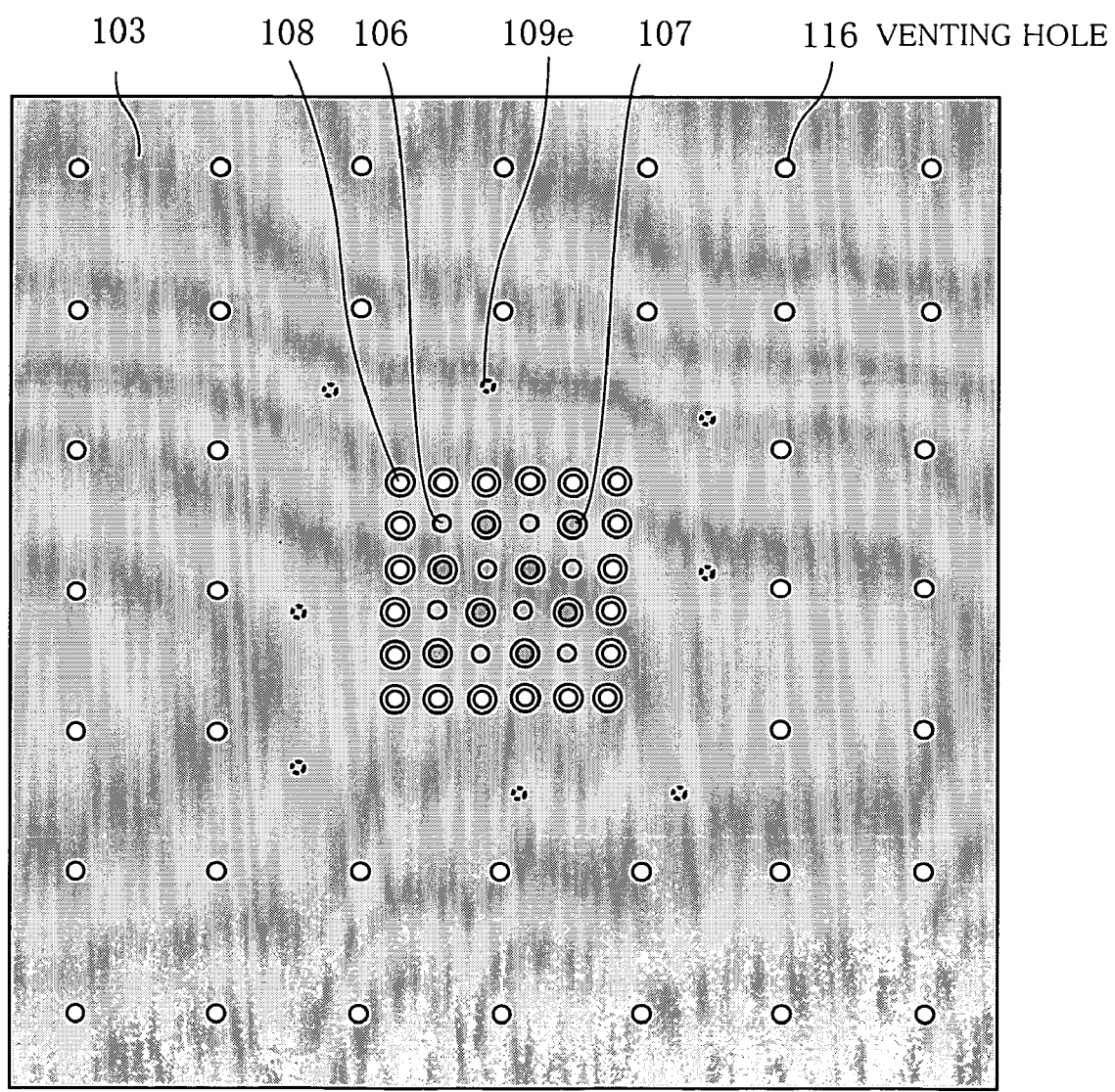
FIG. 19 is a top plan view of a wiring board for a semiconductor integrated circuit package according to a modification example of the first embodiment of the present invention.

Next, a modification example of the third embodiment will be described. This modification example is the package board of the third embodiment in which only the first layer is modified. FIG. 19 shows the top plan view of the first layer of the wiring substrate according to this modification example. In the ground plane of the first layer, venting holes 116 are formed on the ground plane 103 at an area on the outer side of the FC pad forming area. These venting holes are openings for releasing, to the outside the substrate, the moisture absorbed to the substrate at the time of manufacturing the substrate. By providing the venting holes, it is possible to prevent exfoliation of the conductive pattern by the gas that is to go out of the substrate when heating the substrate by reflow or the like.

As the designing rule of the venting holes, such as the opening diameter, interval between the adjacent hole, etc., it is desirable to go by the original rule that is different from the rule for the opening diameter and the interval of the clearances provided to the FC pad part. The reason is as follows. If the venting holes are formed under the same rule as that of the clearances of the FC pad part, there are too many openings on the ground plane, thereby deteriorating the property of the ground plane. As the designing rule of the clearances provided on the FC pad part, it is desirable in terms of the electric property that the interval be the same as that of the FC pads, and the opening diameter be the minimum size by which the ground plane does not come in contact with the FC pad. However, it is desirable for the venting holes to define an appropriate rule such that the area of the conductor pattern becomes larger than the clearance part of the FC pad. The electrical action of this modification example is the same as that of the third embodiment. Further, in this modification example, the venting holes are provided in the ground plane of the first layer. However, the venting holes can be provided in the power-supply/ground plane of the third layer and the fourth layer. The electrical action in that case is the same as that of the modification example whether there are venting holes or not.

The preferred embodiments of the present invention have been described above. However, the present invention is not limited to those embodiments but various modifications are possible within the spirit and broad scope of the appended claims. For example, the ground plane and the power supply plane can be reversed from those of the embodiments. Further, the number of layers in the wiring layer can be selected as appropriate. Furthermore, the embodiments have been described by referring to the case where the chip capacitor is used as the capacitor. However, the capacitor is not limited to this but a thin-film capacitor or a lead-type capacitor can be used. Further, although the capacitor is mounted on the substrate on the same side as that of the LSI chip, they may be disposed on the separate surfaces. Furthermore, the capacitor can be built in the inside of the substrate. In addition, the interlayer connecting structure may not necessarily be the structure in which the via hole is filled with the conductive material but may be the structure in which the inner-wall surface of the opening is coated by a conductive film like a plated through hole. Further, the device to be mounted in the embodiments is the LSI chip in the embodiments. Instead, it may be a device such as CSP which is formed by mounting an LSI chip on a substrate, a device which is formed by mounting an LSI chip on the film-type or tape-type resin base material, or a device which comprises a plurality of LSI chips. Moreover, in the above-described embodiments, the signal line is interposed between the ground plane and the power supply plane. Instead, it may be interposed between the ground planes or between the power supply planes.

What is claimed is:

1. A wiring board for a semiconductor integrated circuit package, comprising:
    a plurality of metal layers including a ground plane, a power supply plane, and a signal wiring layer which are stacked;
    a surface layer in which an electronic device mount part is surrounded by an electrode plane, wherein the electronic device mount part has device connecting pads arranged in an area-array form;
    ground pads and power supply pads arranged on an inner side of the electronic device mount part; and
    connecting wiring for connecting between the electrode plane and one of the connecting pads having a same potential as the electrode plane wherein the electrode plane, the one of the connecting pads, and the connecting wiring are disposed on a same layer.

2. The wiring board for a semiconductor integrated circuit package according to claim 1, wherein the electrode plane is a surface ground plane, and the same potential connecting pads are the ground pads.

3. The wiring board for a semiconductor integrated circuit package according to claim 1, wherein the electrode plane is a surface power supply plane, and the same potential connecting pads are the power supply pads.

4. The wiring board for a semiconductor integrated circuit package according to claim 1, wherein the connecting wiring is formed in a mesh-like form.

5. The wiring board for a semiconductor integrated circuit package according to claim 2, wherein the surface ground plane is formed over an entire surface, except for an opening with a device connecting pad other than the ground pad; and the ground pad is formed on the surface ground plane.

6. The wiring board for a semiconductor integrated circuit package according to claim 3, wherein: the surface power supply plane is formed over an entire surface, except for an opening with a device connecting pad other than the power supply pad; and the power supply pad is formed on the surface power supply plane.

7. The wiring board for a semiconductor integrated circuit package according to claim 2, wherein: an inner-layer ground plane is provided in addition to the surface ground plane; and the inner-layer ground plane is adjacent to the power supply plane that is provided in an inner layer.

8. The wiring board for a semiconductor integrated circuit package according to claim 3, wherein: an inner-layer power supply plane is provided in addition to the surface power supply plane; and the inner-layer power supply plane is adjacent to the ground plane that is provided in an inner layer.

9. The wiring board for a semiconductor integrated circuit package according to claim 1, wherein the signal wiring layer is formed adjacent to a surface ground plane or a surface power supply plane, which constitute a surface plane.

10. The wiring board for a semiconductor integrated circuit package according to claim 2, wherein the signal wiring layer is interposed between the surface ground plane and the ground plane or the power supply plane provided in an inner layer.

11. The wiring board for a semiconductor integrated circuit package according to claim 3, wherein the signal wiring layer is interposed between the surface power supply plane and the ground plane or the power supply plane provided in an inner layer.

12. The wiring board for a semiconductor integrated circuit package according to claim 1, comprising a capacitor mount part which has a capacitor mounting ground pad and a capacitor mounting power supply pad.

13. The wiring board for a semiconductor integrated circuit package according to claim 1, wherein: on a wiring layer that is a electronic device mount surface, a capacitor mount part which has a capacitor mounting ground pad and a capacitor mounting power supply pad is provided outside the electronic device mount part; a capacitor mounting ground pad is provided on a surface ground plane that comprises the surface layer; and an opening for a capacitor mounting power supply pad is formed on the surface ground plane.

14. The wiring board for a semiconductor integrated circuit package according to claim 1, wherein: on a wiring layer that is a electronic device mount surface, a capacitor mount part which has a capacitor mounting ground pad and a capacitor mounting power supply pad is provided outside the electronic device mount part; a capacitor mounting power supply pad is provided on a surface power supply plane that comprises the surface layer; and an opening for a capacitor mounting ground pad is formed on the surface power supply plane.

15. The wiring board for a semiconductor integrated circuit package according to claim 1, wherein venting holes are formed on at least one layer of the ground plane or the power supply plane, which comprise the surface layer.

16. A semiconductor integrated circuit, comprising:
    a plurality of metal layers including a ground plane, a power supply plane, and a signal wiring layer which are stacked;
    a surface layer in which an electronic device mount part is surrounded by an electrode plane;
    an electronic device mount part in which device connecting pads are arranged in an area-array form;
    ground pads and power supply pads arranged on an inner side of the electronic device mount part;
    a connecting wiring for connecting between the electrode plane and one of the connecting pads having a same potential as the electrode plane wherein the electrode plane, the connecting wiring and the one of the connecting pads are disposed on a same layer; and an electronic device mounted on the electronic device mount part.

17. The semiconductor integrated circuit according to claim 16, wherein the electronic device is any one of devices selected from a semiconductor chip, a semiconductor device in which a semiconductor chip is mounted on a circuit board, and a semiconductor device in which a semiconductor chip is sealed by resin.

18. The semiconductor integrated circuit according to claim 16, wherein the electronic device is mounted on a wiring board for a semiconductor integrated circuit package through a bump or a metal ball.

19. The semiconductor integrated circuit according to claim 16, comprising a capacitor.

* * * * *